(12) United States Patent
Kurui et al.

(10) Patent No.: US 12,366,488 B2
(45) Date of Patent: Jul. 22, 2025

(54) SENSOR AND SENSOR SYSTEM

(71) Applicant: KABUSHIKI KAISHA TOSHIBA, Tokyo (JP)

(72) Inventors: Yoshihiko Kurui, Chigasaki Kanagawa (JP); Hiroaki Yamazaki, Yokohama Kanagawa (JP); Fumitaka Ishibashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 526 days.

(21) Appl. No.: 17/823,929

(22) Filed: Aug. 31, 2022

(65) Prior Publication Data

US 2023/0288270 A1 Sep. 14, 2023

(30) Foreign Application Priority Data

Mar. 9, 2022 (JP) .................. 2022-035897

(51) Int. Cl.
*G01L 1/20* (2006.01)
*B81B 3/00* (2006.01)
(Continued)

(52) U.S. Cl.
CPC ............ *G01L 1/148* (2013.01); *B81B 3/0051* (2013.01); *G01L 9/0073* (2013.01); *G01N 27/04* (2013.01);
(Continued)

(58) Field of Classification Search
CPC ........ G01N 27/04; G01N 27/14; G01N 27/18; G01L 1/18; G01L 1/20; G01L 9/0041; G01L 9/0051; G01L 9/0054; B81B 3/0051

See application file for complete search history.

(56) References Cited

U.S. PATENT DOCUMENTS 5,537,882 A * 7/1996 Ugai .................... G01P 15/123
338/42
5,677,965 A * 10/1997 Moret .................. H04R 19/016
381/174
(Continued)

FOREIGN PATENT DOCUMENTS

JP 2013-205105 A 10/2013
JP 2016-17926 A 2/2016
(Continued)

OTHER PUBLICATIONS

Japan Patent Office, Office Action in JP App. No. 2022-035897, 2 pages, and machine translation, 4 pages (Jan. 15, 2025).
(Continued)

*Primary Examiner* — Herbert K Roberts
(74) *Attorney, Agent, or Firm* — Finnegan, Henderson, Farabow, Garrett & Dunner, LLP

(57) ABSTRACT

According to one embodiment, a sensor includes an element part. The element part includes a base body, a first detection support part fixed to the base body, a first detection connection part including a first connection resistance layer and supported by the first detection support part, a first support part fixed to the base body, a first structure body, a first connection part, and a film part. The first structure body includes a first end part and a first other end part. The first end part is supported by the first support part. The first connection part is supported by the first other end part. The film part includes a first detection part and a first part. The first detection part is supported by the first detection connection part. The first part is supported by the first connection part. The film part includes a film part resistance layer.

20 Claims, 18 Drawing Sheets

(51) Int. Cl.
*G01L 1/14* (2006.01)
*G01L 9/00* (2006.01)
*G01L 9/12* (2006.01)
*G01N 27/04* (2006.01)

(52) U.S. Cl.
CPC ......... *B81B 2201/0264* (2013.01); *G01L 1/20* (2013.01)

(56) References Cited

U.S. PATENT DOCUMENTS

| | | | |
|---|---|---|---|
| 11,448,628 B2 * | 9/2022 | Hiramatsu | G01N 27/18 |
| 2003/0209079 A1 * | 11/2003 | Tsukada | G01L 9/0054 |
| | | | 73/754 |
| 2008/0265710 A1 * | 10/2008 | Ikehashi | H01G 5/16 |
| | | | 310/309 |
| 2011/0174799 A1 * | 7/2011 | Ali | H05B 3/267 |
| | | | 438/712 |
| 2013/0259084 A1 | 10/2013 | Ooishi | |
| 2021/0047171 A1 * | 2/2021 | Ishibashi | B81B 3/001 |

FOREIGN PATENT DOCUMENTS

| | | | | |
|---|---|---|---|---|
| JP | 2016017926 A | * | 2/2016 | |
| JP | 2019056607 A | * | 4/2019 | G01N 25/20 |

OTHER PUBLICATIONS

R. Chatim et al., "RF MEMS Capacitor for Microwave Applications," 2013 Int'l Conf. of Inf. and Comm. Tech. (IColCT), pp. 363-366 (2013).

* cited by examiner

SENSOR AND SENSOR SYSTEM

CROSS-REFERENCE TO RELATED APPLICATIONS

This application is based upon and claims the benefit of priority from Japanese Patent Application No. 2022-035897, filed on Mar. 9, 2022; the entire contents of which are incorporated herein by reference.

FIELD

Embodiments described herein relate generally to a sensor and a sensor system.

BACKGROUND

For example, there is a sensor that uses a MEMS (Micro Electro Mechanical Systems) element or the like. It is desirable to improve the characteristics of the sensor.

DETAILED DESCRIPTION

Figure 1:
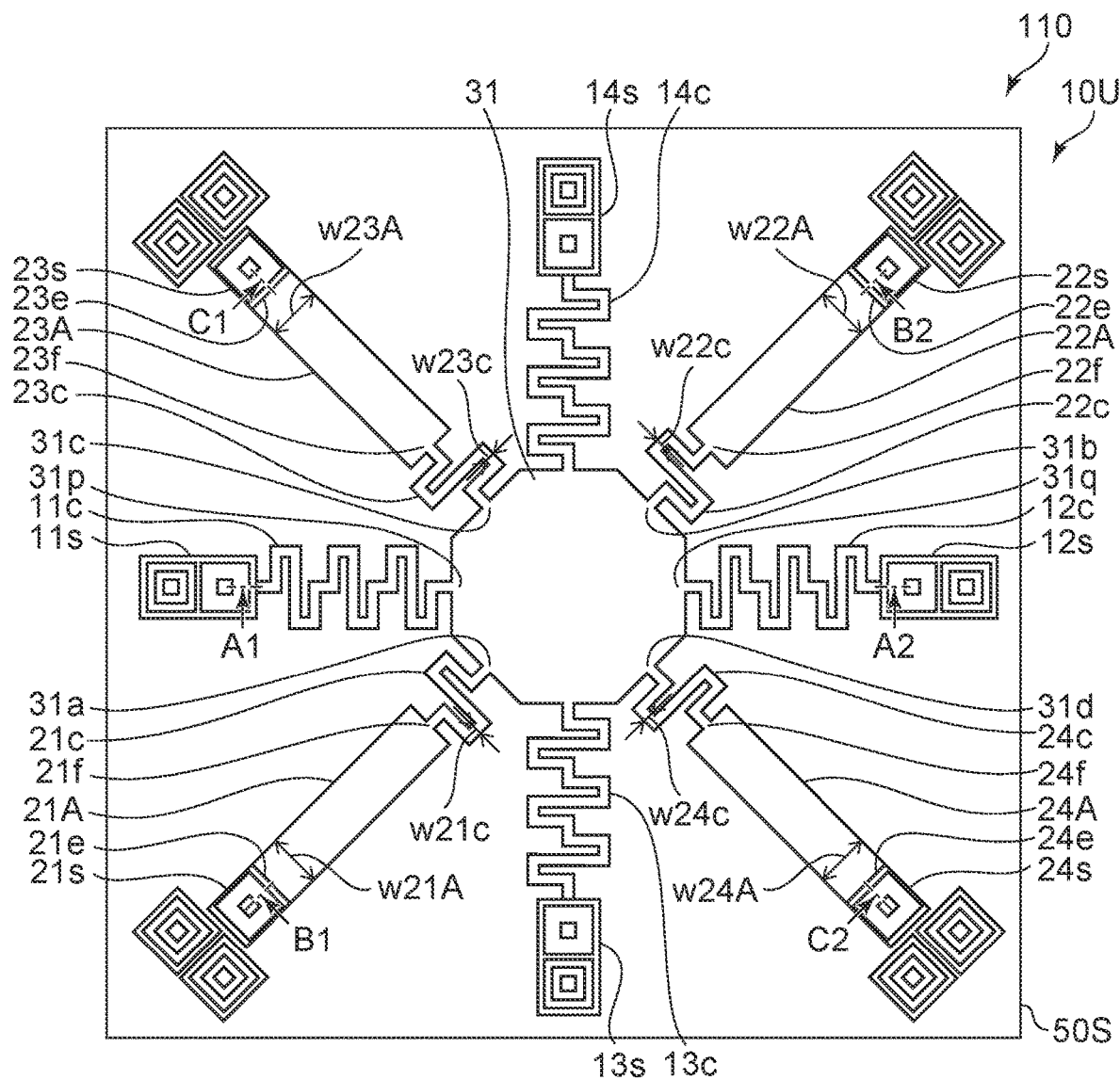
FIG. 1 is a schematic view illustrating a sensor according to a first embodiment.

According to one embodiment, a sensor includes an element part. The element part includes a base body, a first detection support part fixed to the base body, a first detection connection part including a first connection resistance layer and supported by the first detection support part, a first support part fixed to the base body, a first structure body, a first connection part, and a film part. The first structure body includes a first end part and a first other end part. The first end part is supported by the first support part. The first connection part is supported by the first other end part. The film part includes a first detection part and a first part. The first detection part is supported by the first detection connection part. The first part is supported by the first connection part. The film part includes a film part resistance layer electrically connected with the first connection resistance layer. A second direction is from the first detection support part toward the first detection part and crosses a first direction from the base body toward the first detection support part. A first support part direction is from the first support part toward the first part and crosses the first and second directions. A first gap is provided between the base body and the film part, between the base body and the first detection connection part, between the base body and the first structure body, and between the base body and the first connection part. A distance along the first direction between the base body and the first part is greater than a distance along the first direction between the base body and the first end part.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1 to 5 are schematic views illustrating a sensor according to a first embodiment.

Figure 2:
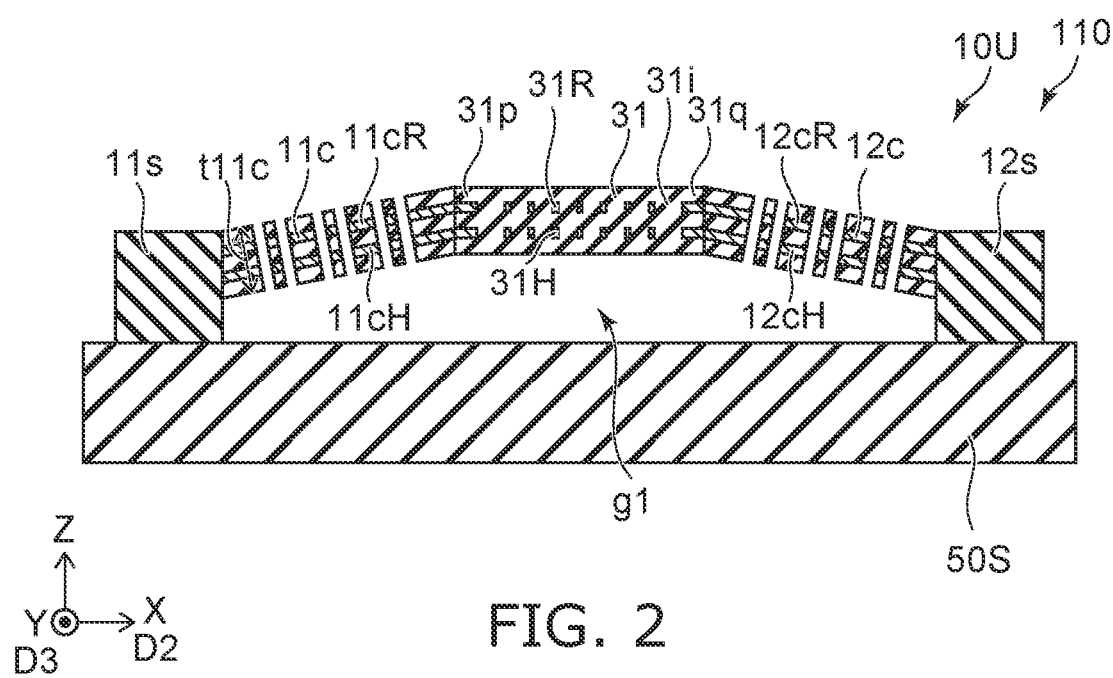
FIG. 2 is a schematic view illustrating the sensor according to the first embodiment.
Figure 3:
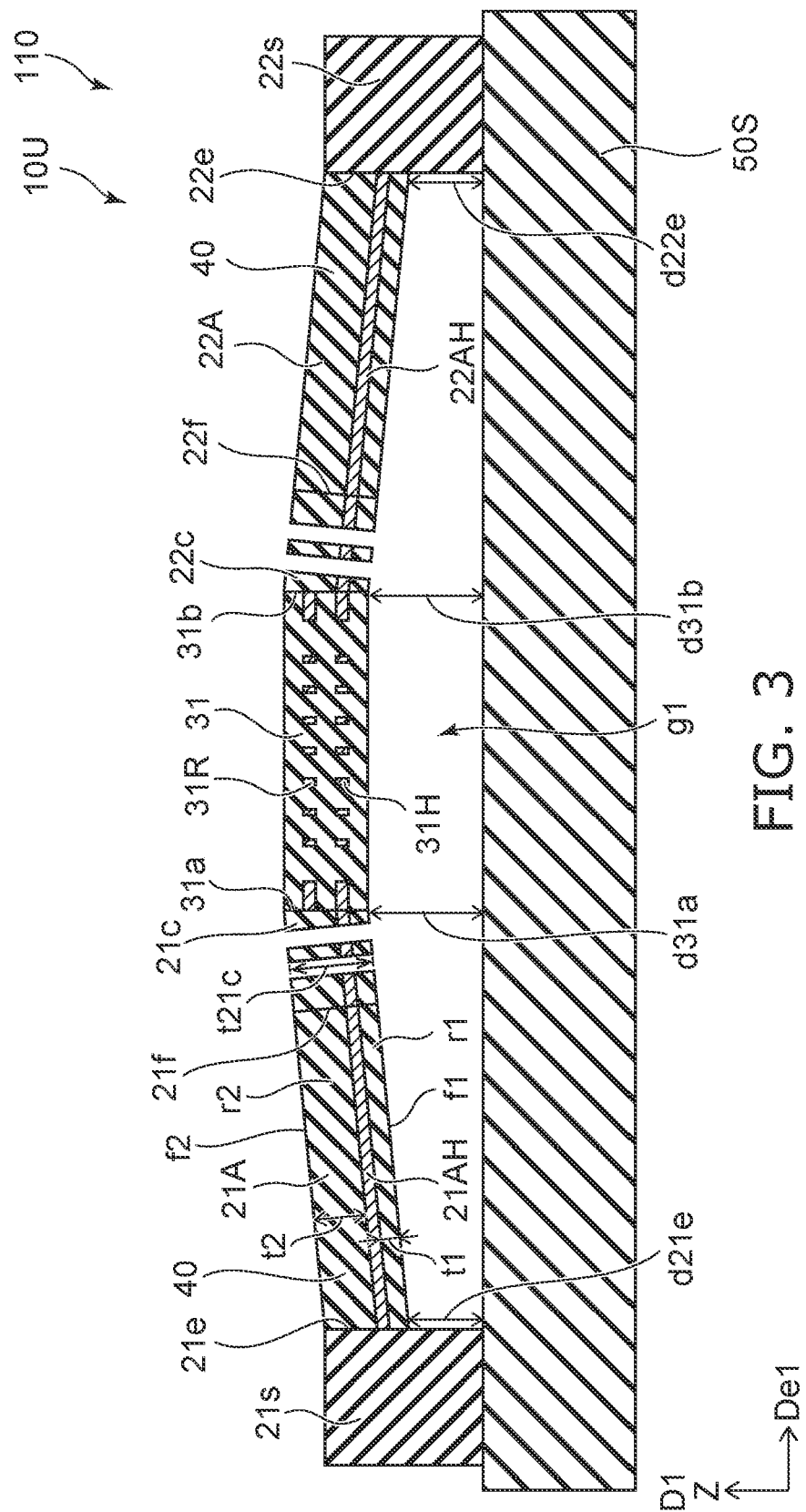
FIG. 3 is a schematic view illustrating the sensor according to the first embodiment.
Figure 4:
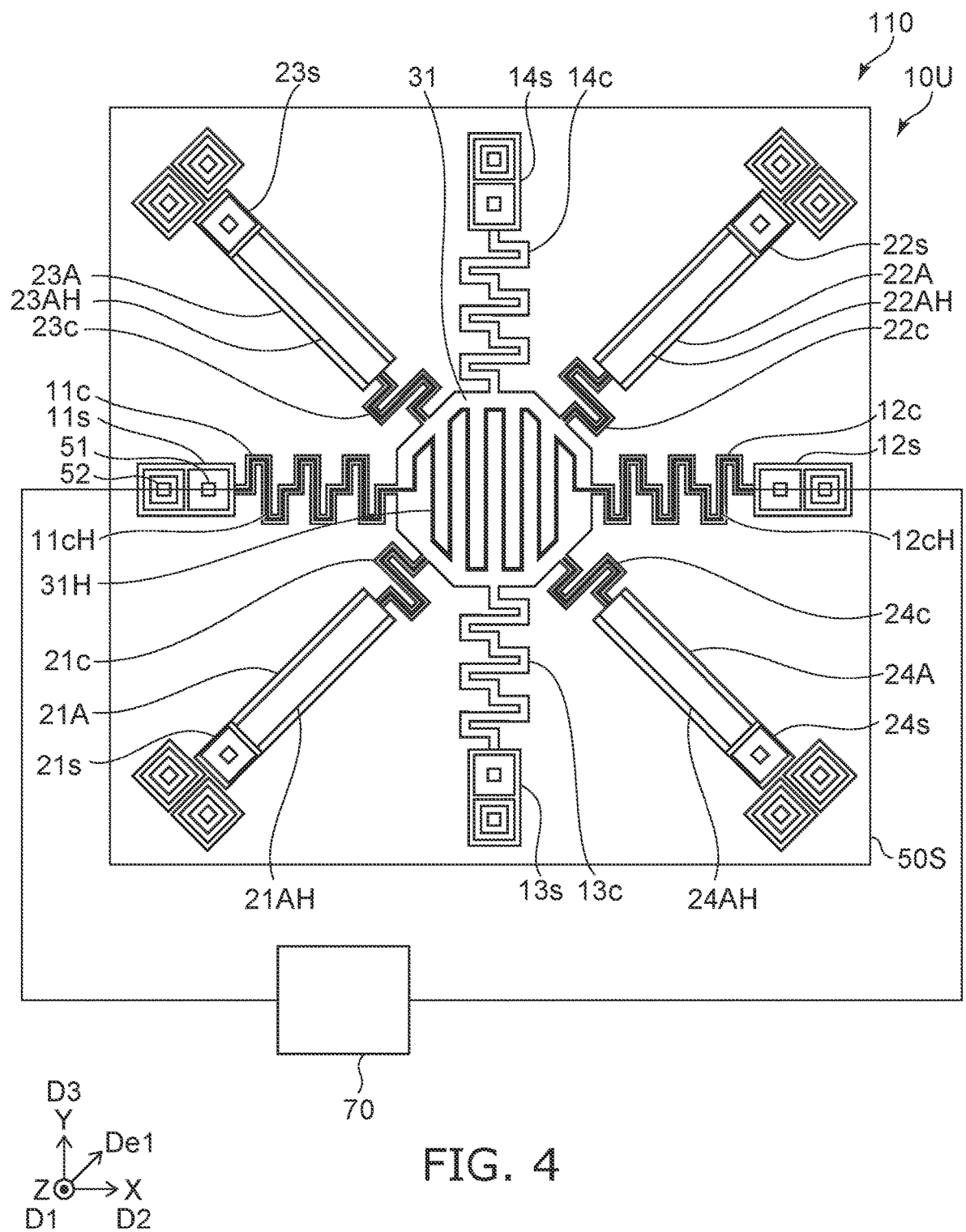
FIG. 4 is a schematic view illustrating the sensor according to the first embodiment.
Figure 5:
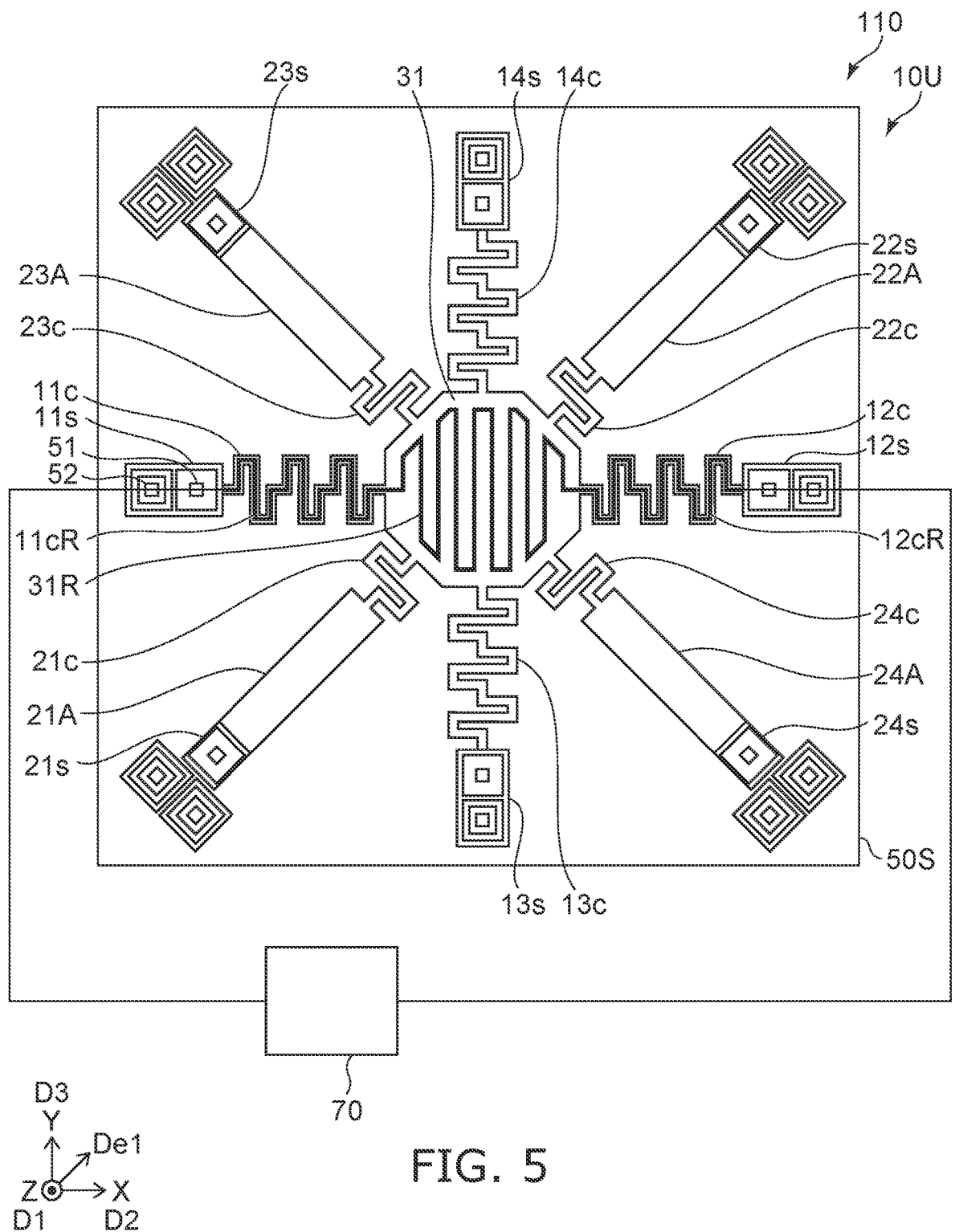
FIG. 5 is a schematic view illustrating the sensor according to the first embodiment.

FIG. 1 is a plan view. FIG. 2 is a line A1-A2 cross-sectional view of FIG. 1. FIG. 3 is a line B1-B2 cross-sectional view of FIG. 1. FIGS. 4 and 5 are plan views of extracted parts included in the sensor.

As shown in FIGS. 1 to 3, the sensor 110 according to the embodiment includes an element part 10U. The element part 10U includes a first detection support part 11s, a first detection connection part 11c, a first support part 21s, a first structure body 21A, a first connection part 21c, and a film part 31.

As shown in FIG. 2, the first detection support part 11s is fixed to a base body 50S. The first detection connection part 11c is supported by the first detection support part 11s. The first detection connection part 11c includes a first connection resistance layer 11cR.

As shown in FIG. 3, the first support part 21s is fixed to the base body 50S. The first structure body 21A includes a first end part 21e and a first other end part 21f. As shown in FIGS. 1 and 3, the first end part 21e is supported by the first support part 21s. The first connection part 21c is supported by the first other end part 21f.

As shown in FIG. 1, the film part 31 includes a first detection part 31p and a first part 31a. As shown in FIGS. 1 and 2, the first detection part 31p is supported by the first detection connection part 11c. As shown in FIGS. 1 and 3, the first part 31a is supported by the first connection part 21c. The film part 31 includes a film part resistance layer 31R. The film part resistance layer 31R is electrically connected with the first connection resistance layer 11cR.

A second direction D2 from the first detection support part 11s toward the first detection part 31p crosses a first direction D1 from the base body 50S toward the first detection support part 11s.

The first direction D1 is taken as a Z-axis direction. One direction perpendicular to the Z-axis direction is taken as an X-axis direction. A direction perpendicular to the Z-axis direction and the X-axis direction is taken as a Y-axis direction. The second direction D2 is, for example, the X-axis direction.

A first support part direction De1 from the first support part 21s toward the first part 31a crosses the first direction D1 and crosses the second direction D2. For example, the first support part direction De1 is tilted with respect to the second direction D2. In the example, the angle between the first support part direction De1 and the second direction D2 is about 45 degrees (e.g., not less than 40 degrees and not more than 50 degrees).

As shown in FIGS. 2 and 3, a first gap g1 is located between the base body 50S and the film part 31, between the base body 50S and the first detection connection part 11c, between the base body 50S and the first structure body 21A, and between the base body 50S and the first connection part 21c.

As shown in FIG. 3, the distance along the first direction D1 between the base body 50S and the first part 31a is a distance d31a. The distance along the first direction D1 between the base body 50S and the first end part 21e is a distance d21e. The distance d31a is greater than the distance d21e.

Resistance layers such as the film part resistance layer 31R, the first connection resistance layer 11cR, etc., are extracted in the illustration of FIG. 5. As shown in FIG. 5, a controller 70 may be located in the sensor 110. The controller 70 may be included in the sensor 110. The controller 70 may be located separately from the sensor 110. The controller 70 is electrically connected with the first connection resistance layer 11cR. The controller 70 is configured to output a signal corresponding to the change of the electrical resistance of the film part resistance layer 31R. This signal corresponds to the concentration of a detection substance around the film part 31. For example, the film part resistance layer 31R functions as a temperature sensor. The temperature of the film part 31 is dependent on the concentration of the detection substance around the film part 31. The concentration of the detection substance can be detected by detecting the temperature of the film part 31.

According to the embodiment, the distance d31a is greater than the distance d21e. For example, the film part 31 is at a higher position than the first end part 21e when referenced to the base body 50S. Thereby, the temperature of the film part 31 is not easily affected by the base body 50S. According to the embodiment, the change of the resistance can be detected stably and with high accuracy. The change of the temperature can be detected stably and with high accuracy. The concentration of the detection substance can be detected stably and with high accuracy. According to the embodiment, a sensor can be provided in which the characteristics can be improved.

For example, there is a reference example in which the distance between the base body 50S and the film part 31 is increased by setting the entire connection part to be high when referenced to the base body 50S. In the reference example, the distances between the base body 50S and the movable parts such as the connection part, the film part 31, etc., are set to be long. In the reference example, the thickness of a sacrificial layer used when patterning the movable parts is thick; and it is difficult to obtain sufficient productivity.

According to the embodiment, the level of the film part 31 is set to be high while maintaining a low first end part 21e of the first structure body 21A. For example, the first structure body 21A is tilted with respect to the base body 50S. Thereby, the distance between the film part 31 and the base body 50S is increased while maintaining a thin sacrificial layer. Thereby, a sensor that has improved characteristics is obtained with high productivity. The tilt of the first structure body 21A may be obtained by stress of the first structure body 21A. Examples of the stress are described below.

In the example as shown in FIG. 2, the first detection connection part 11c includes a first connection conductive layer 11cH. The film part 31 includes a film part conductive layer 31H. The film part conductive layer 31H is electrically connected with the first connection conductive layer 11cH.

The conductive layers such as the film part conductive layer 31H, the first connection conductive layer 11cH, etc., are extracted in the illustration of FIG. 4. As shown in FIG. 4, the controller 70 is electrically connected with the film part conductive layer 31H via the first connection conductive layer 11cH. The controller 70 is configured to heat the film part 31 by supplying a current to the film part conductive layer 31H via the first connection conductive layer 11cH. The film part 31 is heated by the Joule heat of the current. For example, the heat of the film part 31 is propagated via the detection substance around the film part 31. Therefore, the temperature of the film part 31 changes according to the concentration of the detection substance around the film part 31. For example, when the detection substance is carbon dioxide, the temperature of the film part 31 changes according to the concentration of carbon dioxide. According to the embodiment as described above, the change of the temperature of the film part 31 can be detected stably and with high accuracy by detecting the change of the resistance.

As described below, the detection connection part in which the first connection conductive layer 11cH is located may be different from the detection connection part in which the first connection resistance layer 11cR is located. In the sensor 110, the first connection conductive layer 11cH and the first connection resistance layer 11cR are located in one detection connection part. At least a part of the first connection conductive layer 11cH may overlap the first connection resistance layer 11cR in the first direction D1. In the example, the first connection conductive layer 11cH is between the base body 50S and the first connection resistance layer 11cR (see FIG. 2). The first connection resistance layer 11cR may be between the base body 50S and the first connection conductive layer 11cH.

For example, the distance difference described above (the difference between the distance d31a and the distance d21e) is based on stress of the first structure body 21A. For example, the configuration of the cross section along the first direction D1 of the first structure body 21A is asymmetric. A large stress is easily obtained thereby.

As shown in FIG. 3, the first structure body 21A includes a first structure body conductive layer 21AH and a first insulating member 40. The first insulating member 40 includes a first insulating region r1 and a second insulating region r2. The first insulating region r1 is between the base body 50S and the second insulating region r2 in the first direction D1. The first structure body conductive layer 21AH is between the first insulating region r1 and the second insulating region r2 in the first direction D1. A thickness t1 along the first direction D1 of the first insulating region r1 is different from a thickness t2 along the first direction D1 of the second insulating region r2. The first structure body 21A is asymmetric due to such a thickness difference. Thereby, stress is generated in the first structure body 21A. The distance difference described above is obtained by the stress.

In one example, the first structure body conductive layer 21AH includes at least one selected from the group consisting of Ti, TiN, Al, Cu, Si, and SiGe. For example, a film of these materials has compressive stress. The first insulating member 40 includes silicon and at least one selected from the group consisting of oxygen and nitrogen. In one example, the first structure body conductive layer 21AH includes TiN. For example, the TiN film has compressive stress. The first insulating member 40 includes at least one selected from the group consisting of silicon nitride and silicon oxide. In such a case, for example, the thickness t1 along the first direction D1 of the first insulating region r1 is less than the thickness t2 along the first direction D1 of the second insulating region r2. By such a configuration, the first structure body 21A is tilted so that the distance d31a is greater than the distance d21e.

As shown in FIG. 3, the first structure body 21A includes a first surface f1 and a second surface f2. The first surface f1 is between the base body 50S and the second surface f2. The first structure body conductive layer 21AH is between the first surface f1 and the second surface f2 in the first direction D1. The distance along the first direction D1 between the first surface f1 and the first structure body conductive layer 21AH (e.g., corresponding to the thickness t1) is different from the distance along the first direction D1 between the first structure body conductive layer 21AH and the second surface f2 (e.g., corresponding to the thickness t2).

According to the embodiment, the stress of the first structure body 21A may be obtained by a method other than those described above. For example, stress is generated in a layer included in the first structure body 21A by using a different formation condition for the layer. For example, stress can be generated in the layer by causing the layer to have a different density. According to the embodiment, various configurations can be used to cause the distance d31a to be greater than the distance d21e.

Figure 6:
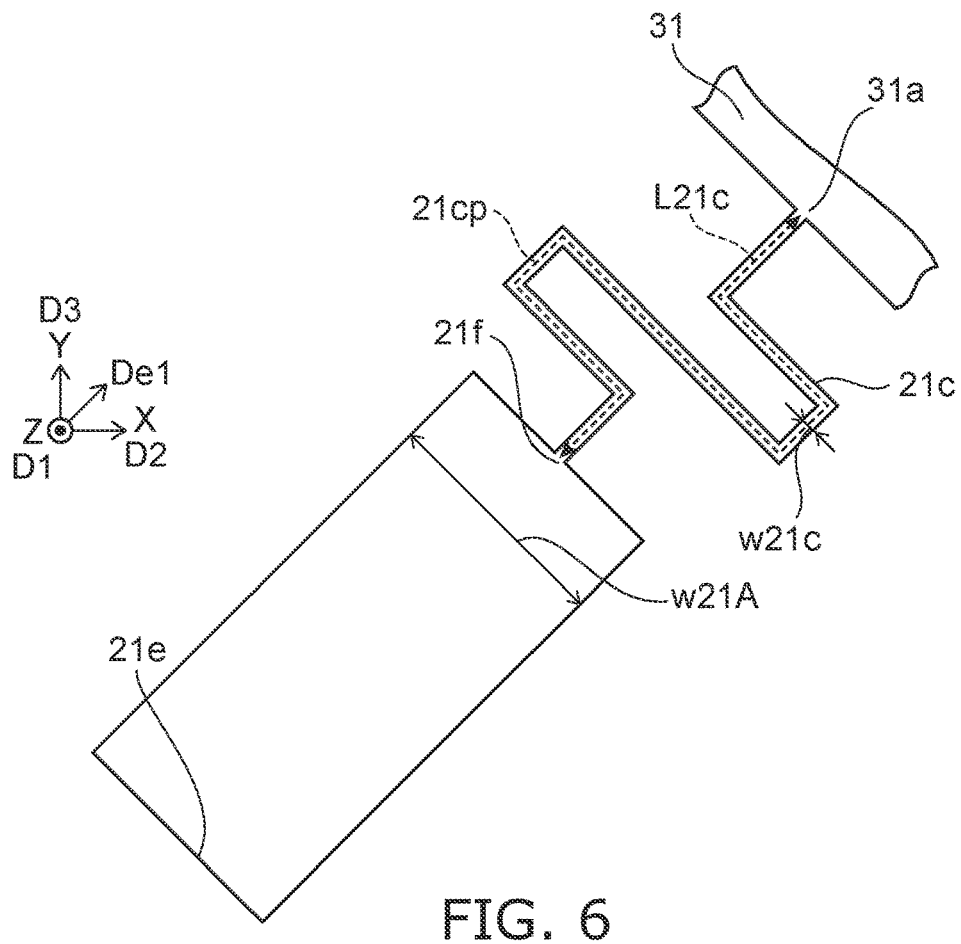
FIG. 6 is a schematic plan view illustrating a part of the sensor according to the first embodiment.

FIG. 6 is a schematic plan view illustrating a part of the sensor according to the first embodiment.

FIG. 6 illustrates the first structure body 21A and the first connection part 21c. As shown in FIG. 6, the first structure body 21A has a first structure body width w21A in the first structure body width direction. The first structure body width direction crosses the first direction D1 and crosses (e.g., is perpendicular to) the direction from the first end part 21e toward the first other end part 21f. The direction from the first end part 21e toward the first other end part 21f corresponds to the extension direction of the first structure body 21A.

The first connection part 21c has a first width w21c in the first connection width direction. The first connection width direction crosses the first direction D1 and crosses the extension direction (a first extension direction) of a path 21cp from the first other end part 21f toward the first part 31a. The first structure body width w21A is greater than the first width w21c.

For example, the spring constant of the first structure body 21A is greater than the spring constant of the first connection part 21c. The first structure body 21A deforms less easily than the first connection part 21c. A large force is easily applied to the film part 31 because the first structure body 21A does not deform easily. Thereby, the distance d31a is easily set to be greater than the distance d21e.

Because the first connection part 21c is located between the first structure body 21A and the film part 31, the propagation of the heat of the film part 31 toward the first structure body 21A can be suppressed. Thereby, it is easy to efficiently detect the change of the temperature of the film part 31.

As shown in FIG. 6, the first connection part 21c has a first length L21c. The first length L21c is the length along a first extension direction of the first connection part 21c (the extension direction of the path 21cp).

As described above, the first connection part 21c has the first width w21c. The first width w21c is a width along a direction that crosses the first direction D1 and crosses the extension direction (the first extension direction) of the path 21cp. As shown in FIG. 3, the first connection part 21c has a first thickness t21c along the first direction D1. The first connection part 21c has a first Young's modulus.

Figure 7:
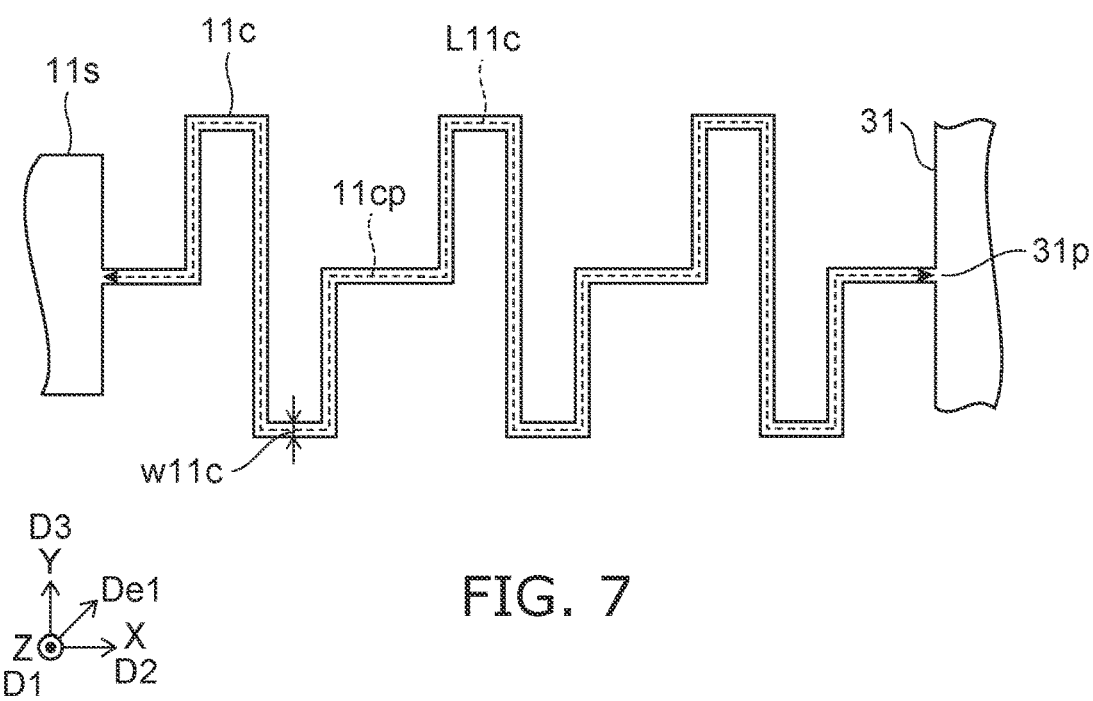
FIG. 7 is a schematic plan view illustrating a part of the sensor according to the first embodiment.

FIG. 7 is a schematic plan view illustrating a part of the sensor according to the first embodiment.

FIG. 7 illustrates the first detection connection part 11c. As shown in FIG. 7, the first detection connection part 11c has a first detection length L11c. The first detection length L11c is the length of the first detection connection part 11c along an extension path 11cp of the first detection connection part 11c. The first detection connection part 11c has a first detection width w11c. The first detection width w11c is the width of the first detection connection part 11c along a direction that crosses the first direction D1 and crosses the extension path 11cp of the first detection connection part 11c. As shown in FIG. 2, the first detection connection part 11c has a first detection thickness t11c. The first detection thickness t11c is the thickness of the first detection connection part 11c along the first direction D1. The first detection connection part 11c has a first detection Young's modulus.

For example, the first length L21c is less than the first detection length L11c. For example, the first width w21c is greater than the first detection width w11c. For example, the first thickness t21c is greater than the first detection thickness t11c. For example, the first Young's modulus is greater than the first detection Young's modulus. By such a configuration, the spring constant of the first connection part 21c can be greater than the spring constant of the first detection connection part 11c. For example, the first connection part 21c deforms less easily than the first detection connection part 11c.

Because the first connection part 21c does not deform easily, the force from the first structure body 21A can be efficiently applied to the film part 31.

According to the embodiment, for example, the first connection part 21c may include at least one of the first length L21c that is less than the first detection length L11c, the first width w21c that is greater than the first detection width w11c, the first thickness t21c that is greater than the first detection thickness t11c, or the first Young's modulus that is greater than the first detection Young's modulus.

The first connection part 21c may have a meandering structure as shown in FIG. 6. The first detection connection part 11c may have a meandering structure as shown in FIG. 7.

In the sensor 110 as shown in FIG. 1, the element part 10U further includes a second detection support part 12s, a second detection connection part 12c, a second support part 22s, a second structure body 22A, and a second connection part 22c.

As shown in FIGS. 1 and 2, the second detection support part 12s is fixed to the base body 50S. The second detection connection part 12c is supported by the second detection support part 12s. In the example as shown in FIG. 2, the second detection connection part 12c includes a second connection conductive layer 12cH and a second connection resistance layer 12cR.

As shown in FIGS. 1 and 3, the second support part 22s is fixed to the base body 50S. The second structure body 22A includes a second end part 22e and a second other end part 22f. The second end part 22e is supported by the second support part 22s. The second connection part 22c is supported by the second other end part 22f.

As shown in FIG. 1, the film part 31 includes a second detection part 31q and a second part 31b. The second detection part 31q is supported by the second detection connection part 12c. The second part 31b is supported by the second connection part 22c.

As shown in FIG. 4, the film part conductive layer 31H is electrically connected with the first and second connection conductive layers 11cH and 12cH. As shown in FIG. 3, the film part resistance layer 31R is electrically connected with the first and second connection resistance layers 11cR and 12cR.

The direction from the second detection support part 12s toward the second detection part 31q is along the second direction D2. For example, the direction from the second detection support part 12s toward the second detection part 31q is substantially parallel to the second direction D2. The film part 31 is between the first detection connection part 11c and the second detection connection part 12c in the second direction D2.

A second support part direction from the second support part 22s toward the second part 31b crosses the first direction D1 and is along the first support part direction De1. The film part 31 is between the first connection part 21c and the second connection part 22c in the first support part direction De1.

As shown in FIGS. 2 and 3, the first gap g1 is located between the base body 50S and the second detection connection part 12c, between the base body 50S and the second structure body 22A, and between the base body 50S and the second connection part 22c.

As shown in FIG. 3, a distance d31b along the first direction D1 between the base body 50S and the second part 31b is greater than a distance d22e along the first direction D1 between the base body 50S and the second end part 22e.

Thus, the film part 31 also may be supported by the first structure body 21A, the first connection part 21c, the second structure body 22A, and the second connection part 22c. A stable distance is easily obtained.

The configurations of the second structure body 22A and the second connection part 22c may be respectively similar to the configurations of the first structure body 21A and the first connection part 21c. As shown in FIG. 3, the second structure body 22A includes a second structure body conductive layer 22AH and the first insulating member 40.

As shown in FIG. 1, the second structure body 22A has a second structure body width w22A in a second structure body width direction. The second structure body width direction crosses the first direction D1 and crosses the direction from the second end part 22e toward the second other end part 22f. The second connection part 22c has a second width w22c in a second connection width direction. The second connection width direction crosses the first direction D1 and crosses the extension direction of the path from the second other end part 22f toward the second part 31b. The second structure body width w22A is greater than the second width w22c.

For example, a high spring constant is obtained in the second structure body 22A. The propagation of the heat of the film part 31 toward the second structure body 22A via the fine second connection part 22c can be suppressed.

The electrical connection between the first connection conductive layer 11cH and the controller 70 may be performed via one of a first terminal 51 or a second terminal 52 (see FIG. 4). The electrical connection between the second connection conductive layer 12cH and the controller 70 may be performed via terminals similar to such terminals.

The electrical connection between the first connection resistance layer 11cR and the controller 70 may be performed via the other of the first terminal 51 or the second terminal 52 (see FIG. 5). The electrical connection between the second connection resistance layer 12cR and the controller 70 may be performed via terminals similar to such terminals. Examples of the configuration of the first and second terminals 51 and 52 are described below.

As shown in FIG. 1, the element part 10U may include a third support part 23s, a third structure body 23A, a third connection part 23c, a fourth support part 24s, a fourth structure body 24A, and a fourth connection part 24c.

Figure 8:
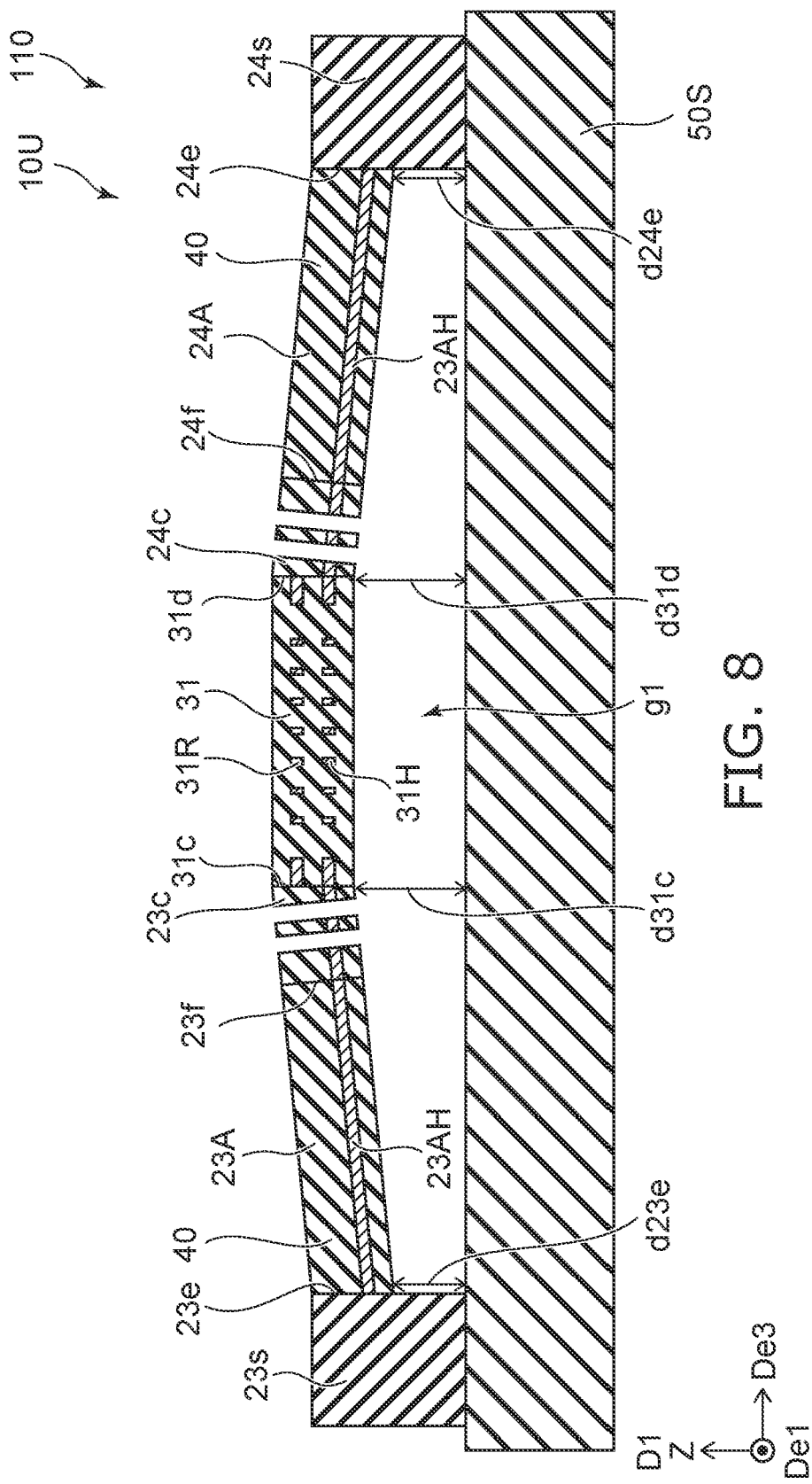
FIG. 8 is a schematic cross-sectional view illustrating the sensor according to the first embodiment.

FIG. 8 is a schematic cross-sectional view illustrating the sensor according to the first embodiment.

FIG. 8 is a line C1-C2 cross-sectional view of FIG. 1. As shown in FIG. 8, the third support part 23s is fixed to the base body 50S. The third structure body 23A includes a third end part 23e and a third other end part 23f. The third end part 23e is supported by the third support part 23s. The third connection part 23c is supported by the third other end part 23f.

The fourth support part 24s is fixed to the base body 50S. The fourth structure body 24A includes a fourth end part 24e and a fourth other end part 24f. The fourth end part 24e is supported by the fourth support part 24s. The fourth connection part 24c is supported by the fourth other end part 24f.

As shown in FIGS. 1 and 8, the film part 31 includes a third part 31c and a fourth part 31d. The third part 31c is supported by the third connection part 23c. The fourth part 31d is supported by the fourth connection part 24c.

As shown in FIG. 1, a third support part direction De3 from the third support part 23s toward the third part 31c crosses the first direction D1. A fourth support part direction from the fourth support part 24s toward the fourth part 31d crosses the first direction D1 and is along the third support part direction De3. The third support part direction De3 crosses the first support part direction De1.

As shown in FIG. 1, the film part 31 is between the third connection part 23c and the fourth connection part 24c in the third support part direction De3.

As shown in FIG. 8, the first gap g1 is located between the base body 50S and the third structure body 23A, between the base body 50S and the third connection part 23c, between the base body 50S and the fourth structure body 24A, and between the base body 50S and the fourth connection part 24c.

A distance d31c along the first direction D1 between the base body 50S and the third part 31c is greater than a distance d23e along the first direction D1 between the base body 50S and the third end part 23e. A distance d31d along the first direction D1 between the base body 50S and the fourth part 31d is greater than a distance d24e along the first direction D1 between the base body 50S and the fourth end part 24e.

Thus, the film part 31 also may be supported by the third structure body 23A, the third connection part 23c, the fourth structure body 24A, and the fourth connection part 24c. A stable distance is easily obtained.

For example, as shown in FIG. 1, the position of the first detection connection part 11c in a third direction D3 is between the position of the first structure body 21A in the third direction D3 and the position of the third structure body 23A in the third direction D3. The third direction D3 crosses a plane including the first and second directions D1 and D2.

The position of the second detection connection part 12c in the third direction D3 is between the position of the fourth structure body 24A in the third direction D3 and the position of the second structure body 22A in the third direction D3.

The angle between the first support part direction De1 and the third support part direction De3 is, for example, not less than 88 degrees and not more than 92 degrees. The third support part direction De3 may be substantially orthogonal to the first support part direction De1.

Because the film part 31 is supported by such first to fourth structure bodies 21A to 24A and such first to fourth connection parts 21c to 24c, the distance between the film part 31 and the base body 50S is more stable. For example, a tilt of the film part 31 with respect to the X-Y plane can be suppressed. For example, the film part 31 is supported in two different axis directions in the X-Y plane. A more stable distance is obtained. More stable characteristics are obtained.

The configurations of the third structure body 23A, the third connection part 23c, the fourth structure body 24A, and the fourth connection part 24c may be respectively similar to the configurations of the first structure body 21A and the first connection part 21c. For example, as shown in FIG. 8, the third structure body 23A includes a third structure body conductive layer 23AH and the first insulating member 40. As shown in FIG. 8, the fourth structure body 24A includes a fourth structure body conductive layer 24AH and the first insulating member 40.

As shown in FIG. 1, the third structure body 23A has a third structure body width w23A in a third structure body width direction. The third structure body width direction crosses the first direction D1 and crosses the direction from the third end part 23e toward the third other end part 23f. The third connection part 23c has a third width w23c in a third connection width direction. The third connection width direction crosses the first direction D1 and crosses the extension direction of the path from the third other end part 23f toward the third part 31c. The third structure body width w23A is greater than the third width w23c.

As shown in FIG. 1, the fourth structure body 24A has a fourth structure body width w24A in a fourth structure body width direction. The fourth structure body width direction crosses the first direction D1 and crosses the direction from the fourth end part 24e toward the fourth other end part 24f. The fourth connection part 24c has a fourth width w24c in a fourth connection width direction. The fourth connection width direction crosses the first direction D1 and crosses the extension direction of the path from the fourth other end part 24f toward the fourth part 31d. The fourth structure body width w24A is greater than the fourth width w24c.

For example, high spring constants are obtained in the third and fourth structure bodies 23A and 24A. The propagation of the heat of the film part 31 toward the third and fourth structure bodies 23A and 24A via the fine third and fourth connection parts 23c and 24c can be suppressed.

As shown in FIG. 1, the element part 10U may include a support part 13s, a connection part 13c, a support part 14s, a connection part 14c, etc. These support parts are fixed to the base body 50S. These connection parts are supported by the support parts. These connection parts may be connected to the film part 31.

Figure 9:
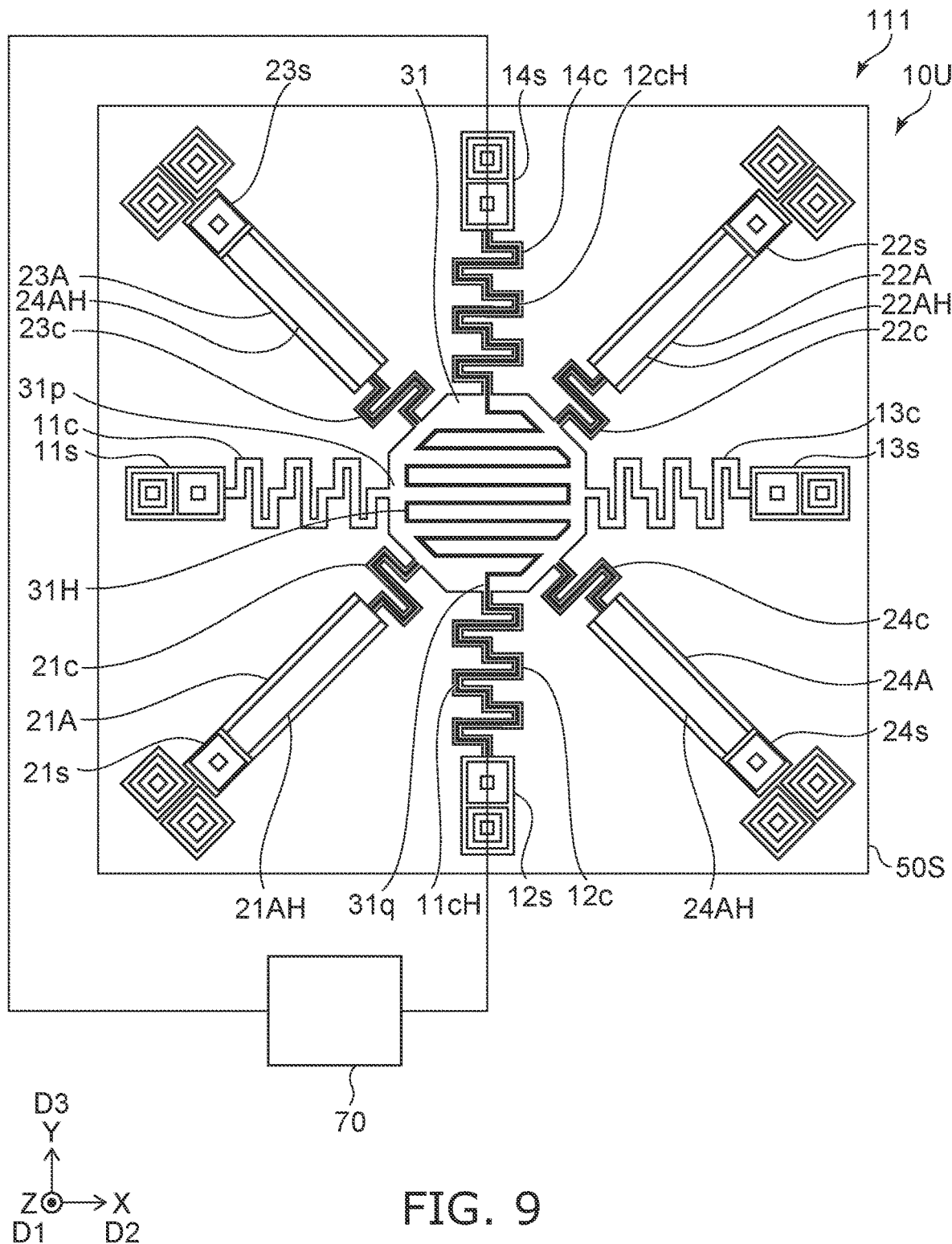
FIG. 9 is a schematic plan view illustrating a sensor according to the first embodiment.
Figure 10:
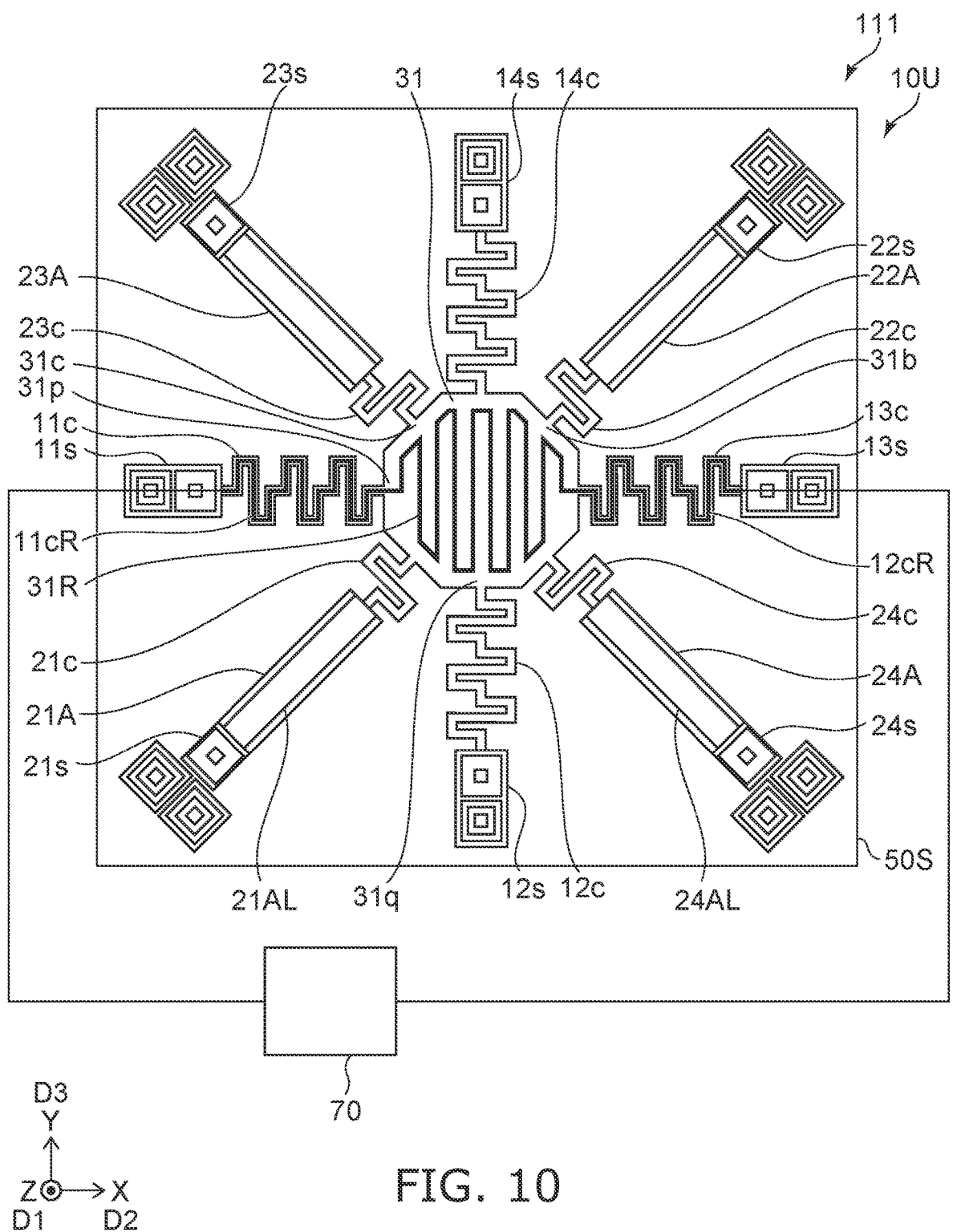
FIG. 10 is a schematic plan view illustrating the sensor according to the first embodiment.

FIGS. 9 and 10 are schematic plan views illustrating a sensor according to the first embodiment.

These drawings illustrate the sensor 111 according to the embodiment. FIG. 9 illustrates a layer of the sensor 111 that includes the film part conductive layer 31H. FIG. 10 illustrates a layer of the sensor 111 that includes the film part resistance layer 31R.

As shown in FIG. 9, the element part 10U includes the first detection support part 11s, the first detection connection part 11c, the second detection support part 12s, and the second detection connection part 12c. Other than the second detection support part 12s and the second detection connection part 12c, the configuration of the sensor 111 may be similar to the configuration of the sensor 110.

As shown in FIG. 10, for example, in the sensor 111 as well, the first connection resistance layer 11cR is located in the first detection connection part 11c. In the sensor 111, the first connection conductive layer 11cH is located in a detection connection part that is different from the first detection connection part 11c.

In the sensor 111, the second detection support part 12s is fixed to the base body 50S. The second detection connection part 12c is supported by the second detection support part 12s.

As shown in FIG. 9, the second detection connection part 12c includes the first connection conductive layer 11cH. The film part 31 includes the second detection part 31q. The second detection part 31q is supported by the second detection connection part 12c. The film part 31 includes the film part conductive layer 31H that is electrically connected with the first connection conductive layer 11cH. The direction from the second detection support part 12s toward the second detection part 31q crosses the second direction D2.

Otherwise, the configuration of the second detection connection part 12c of the sensor 111 may be similar to the configuration of the second detection connection part 12c of the sensor 110. For example, in the sensor 111, the first gap g1 is located between the base body 50S and the second detection connection part 12c (see FIG. 2).

Thus, according to the embodiment, the first connection resistance layer 11cR may be located in the first detection connection part 11c; and the first connection conductive layer 11cH may be located in the second detection connection part 12c. In such a case, for example, as shown in FIG. 9, the second connection conductive layer 12cH may be located in the connection part 14c. As shown in FIG. 10, the second connection resistance layer 12cR may be located in the connection part 13c.

In the sensor 111 as well, the distance d31a is greater than the distance d21e (see FIG. 3). For example, the film part 31 is at a higher position than the first end part 21e when referenced to the base body 50S. In the sensor 111 as well, the concentration of the detection substance can be detected stably and with high accuracy. A sensor can be provided in which the characteristics can be improved.

Figure 11:
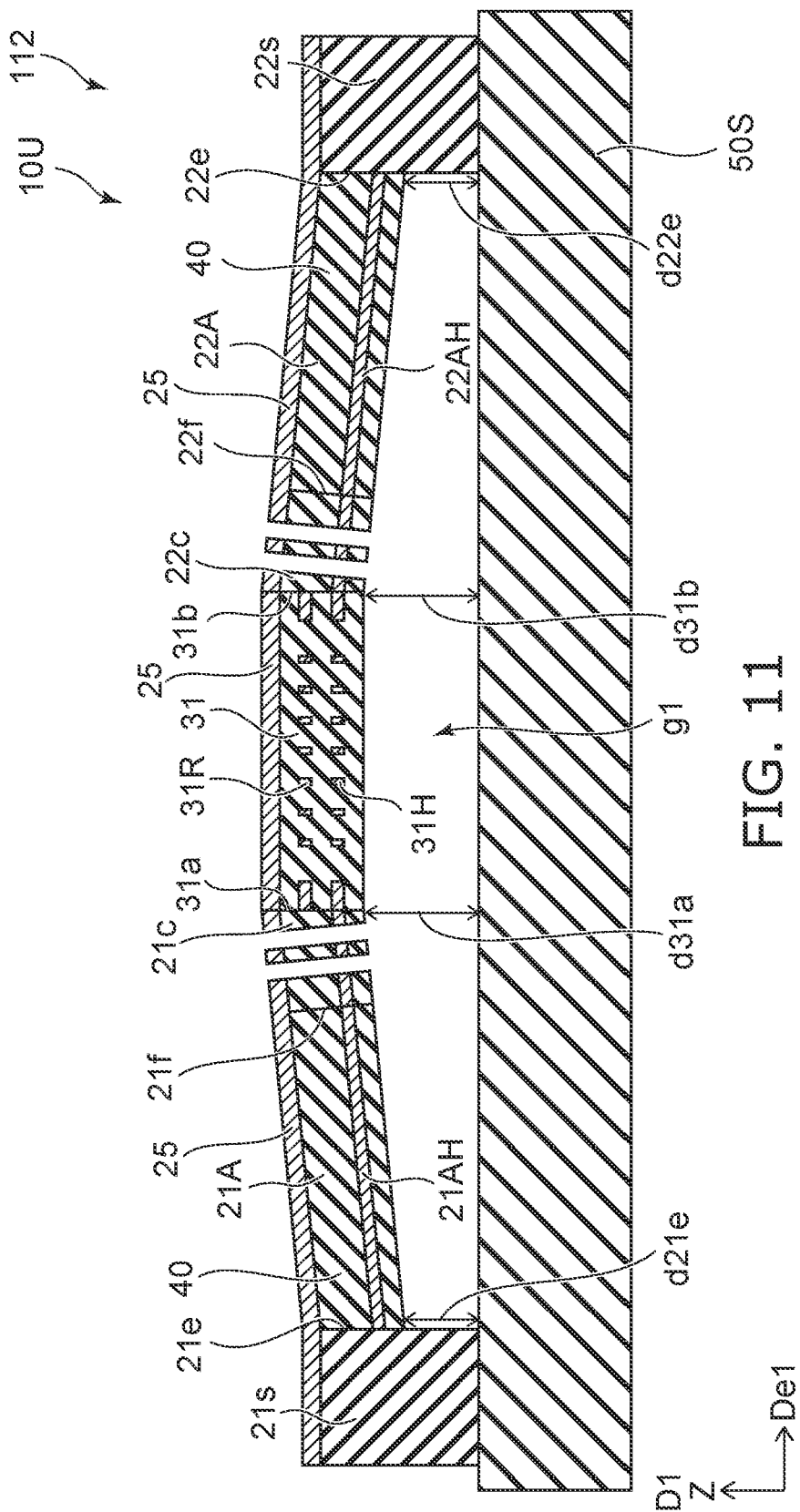
FIG. 11 is a schematic plan view illustrating a sensor according to the first embodiment.

FIG. 11 is a schematic plan view illustrating a sensor according to the first embodiment.

In the sensor 112 according to the embodiment as shown in FIG. 11, the first structure body 21A includes a first film 25 and the first insulating member 40. Otherwise, the configuration of the sensor 112 may be similar to the configuration of the sensor 110 or 111.

In the sensor 112, the first insulating member 40 is between the base body 50S and the first film 25. The first film 25 includes, for example, at least one selected from the group consisting of Pd, $SiO_2$, SiN, and SiGe (a first material). The first film 25 may include, for example, an alloy that includes Pd. The alloy includes Pd and at least one selected from the group consisting of Pt, Cu, Si, and Au. For example, the film of the first material has tensile stress. Tensile stress is generated in the film of the first material by adjusting the formation conditions of the film of the first material. For example, the first insulating member includes silicon and at least one selected from the group consisting of oxygen and nitrogen. Thus, a stacked structure of different materials is applied to the first structure body 21A. A large stress is easily obtained thereby. It is easy to make the distance d31a stable and greater than the distance d21e.

The first film 25 may be located in another structure body (e.g., the second to fourth structure bodies 22A to 24A, etc.). The first film 25 may be located in the film part 31. The first film 25 may not be located in the film part 31.

Figure 12:
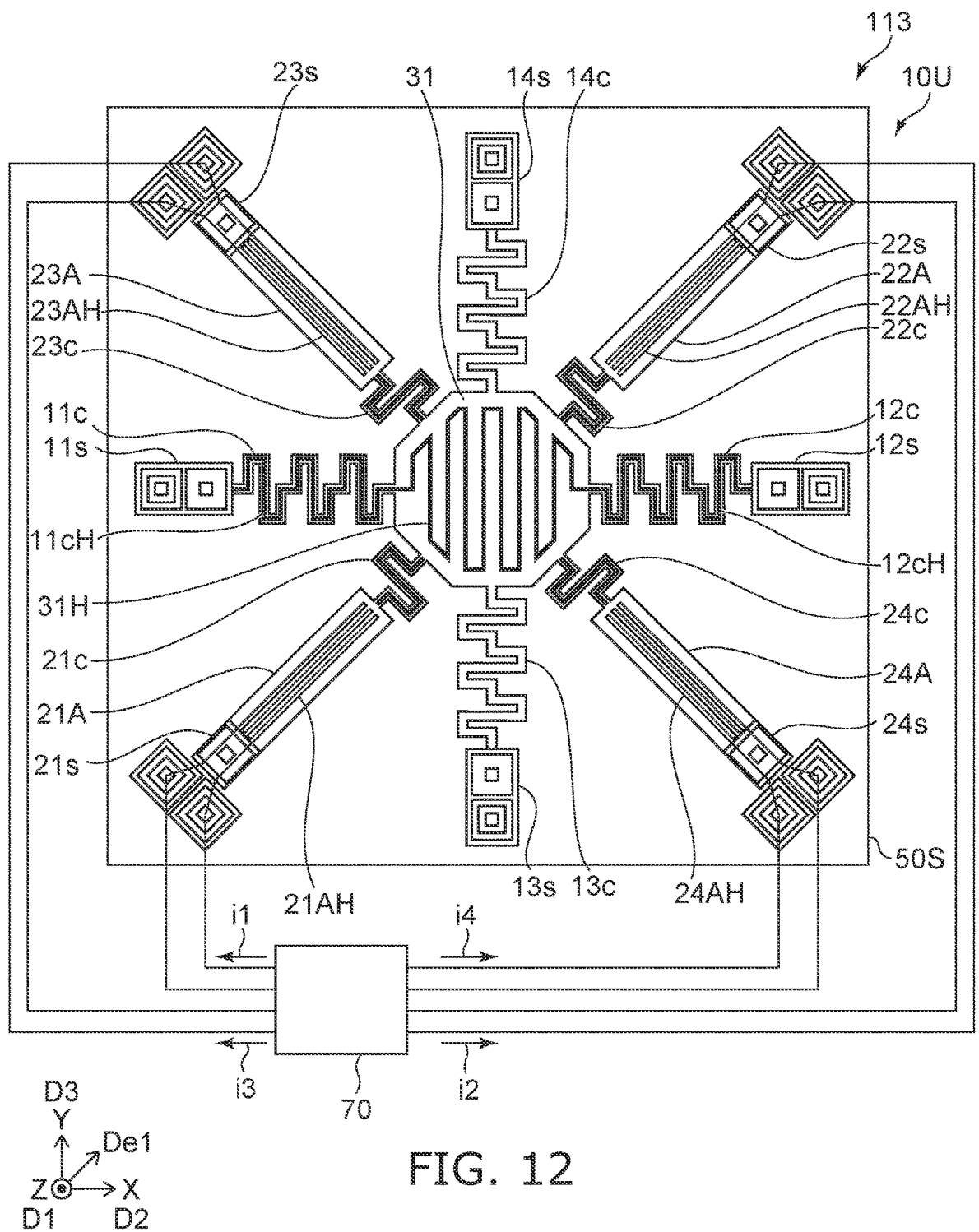
FIG. 12 is a schematic view illustrating a sensor according to the first embodiment.

FIG. 12 is a schematic view illustrating a sensor according to the first embodiment.

In the sensor 113 according to the embodiment as shown in FIG. 12, the controller 70 is configured to supply a first control current i1 to the first structure body conductive layer 21AH. The controller 70 may be configured to supply a second control current i2 to the second structure body conductive layer 22AH. The controller 70 may be configured to supply a third control current i3 to the third structure body conductive layer 23AH. The controller 70 is configured to supply a fourth control current i4 to the fourth structure body conductive layer 24AH. The shapes of the structure bodies can be controlled by controlling these control currents.

For example, the controller 70 is configured to control the distance along the first direction D1 between the base body 50S and the film part 31 by controlling the first control current i1. For example, this distance corresponds to the distance d31a along the first direction D1 between the base body 50S and the first part 31a. Otherwise, the configuration of the sensor 113 may be similar to the sensors 110 to 112.

In the sensor 113, the first to fourth structure body conductive layers 21AH to 24AH have meandering structures. An appropriate resistance is easily obtained. In the sensor 113, the first to fourth currents i1 to i4 may be independently controlled.

Figure 13:
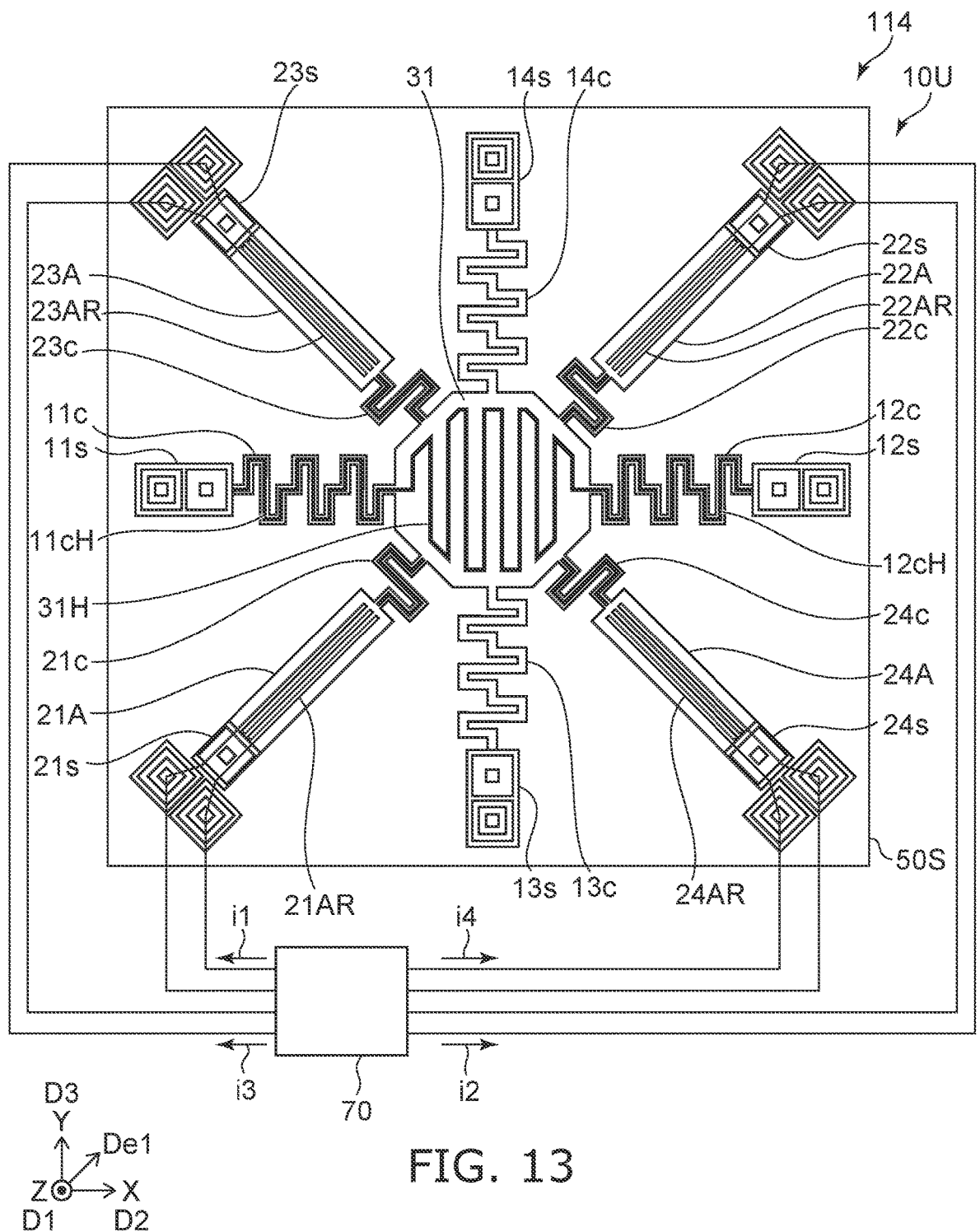
FIG. 13 is a schematic view illustrating a sensor according to the first embodiment.
Figure 14:
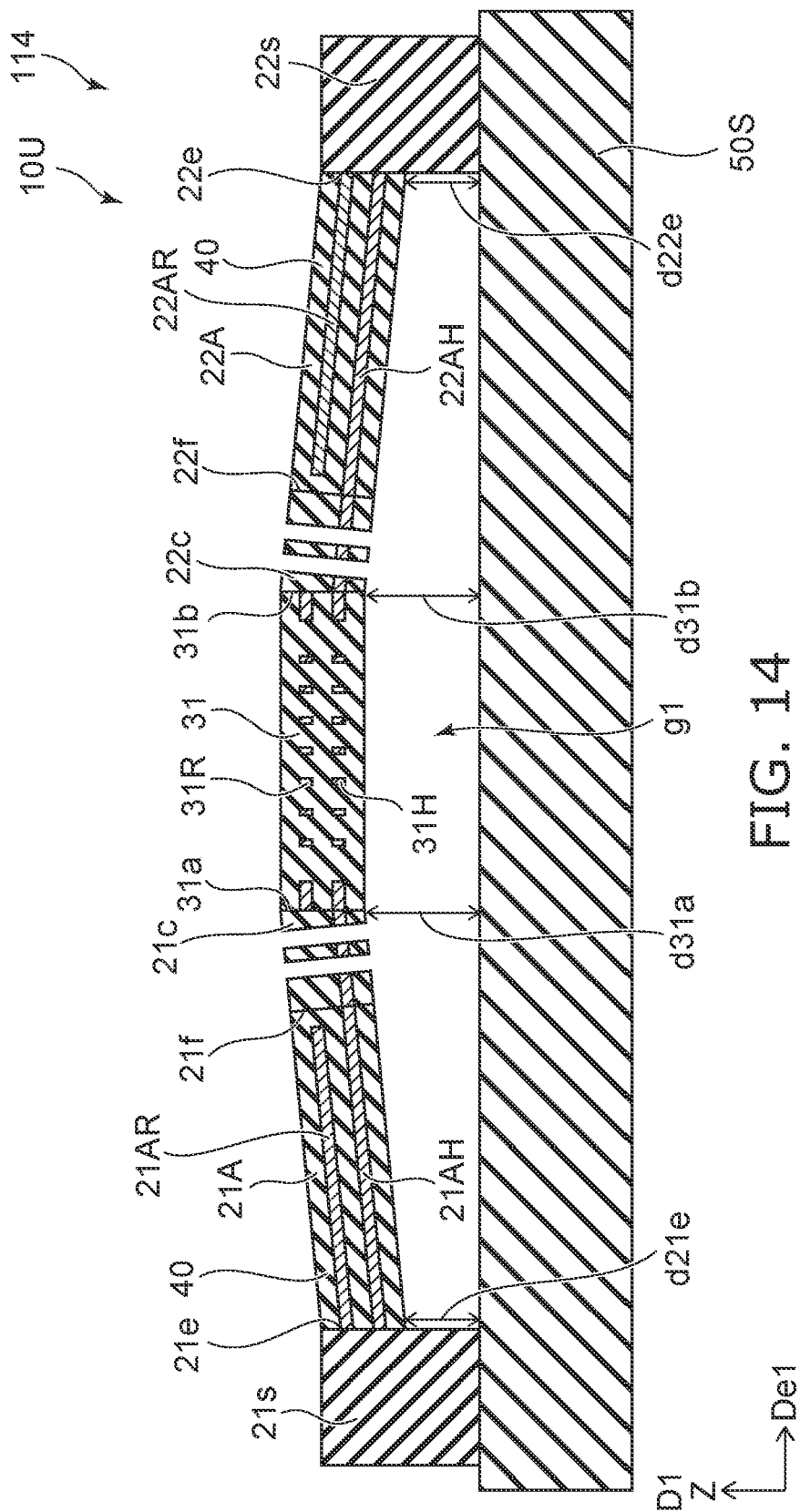
FIG. 14 is a schematic view illustrating the sensor according to the first embodiment.

FIGS. 13 and 14 are schematic views illustrating a sensor according to the first embodiment.

FIG. 13 is a plan view. FIG. 14 is a cross-sectional view. In the sensor 114 according to the embodiment as shown in FIG. 13, the first structure body 21A includes a first structure body resistance layer 21AR. The controller 70 is configured to supply the first control current i1 to the first structure body resistance layer 21AR. The shape of the first structure body 21A can be controlled by the first control current i1.

As shown in FIG. 14, the first structure body 21A includes the first structure body conductive layer 21AH and the first structure body resistance layer 21AR. For example, the distance d31a is set to be greater than the distance d21e by the stress based on the first structure body conductive layer 21AH. The difference between the distance d31a and the distance d21e can be adjusted by controlling the first control current i1 supplied to the first structure body resistance layer 21AR. In the example as shown in FIG. 14, the first structure body conductive layer 21AH is between the base body 50S and the first structure body resistance layer 21AR.

The second structure body 22A may include a second structure body resistance layer 22AR. The third structure body 23A may include a third structure body resistance layer 23AR. The fourth structure body 24A may include a fourth structure body resistance layer 24AR. The controller 70 is configured to supply the second control current i2 to the second structure body resistance layer 22AR. The controller 70 is configured to supply the third control current i3 to the third structure body resistance layer 23AR. The controller 70 is configured to supply the fourth control current i4 to the fourth structure body resistance layer 24AR. The distance difference can be adjusted by adjusting these control currents. Otherwise, the configuration of the sensor 114 may be similar to the sensors 110 to 112.

Figure 15:
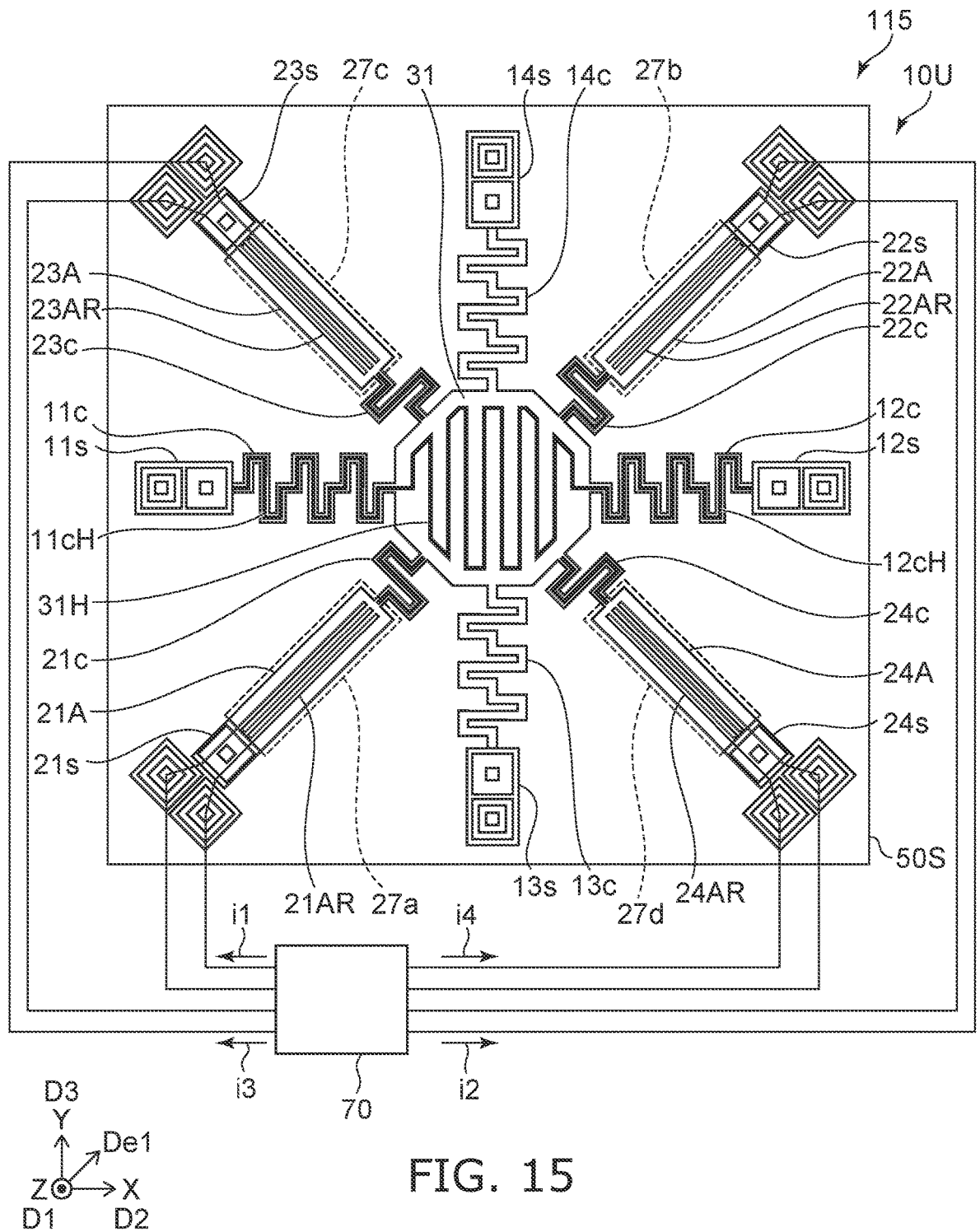
FIG. 15 is a schematic view illustrating a sensor according to the first embodiment.
Figure 16:
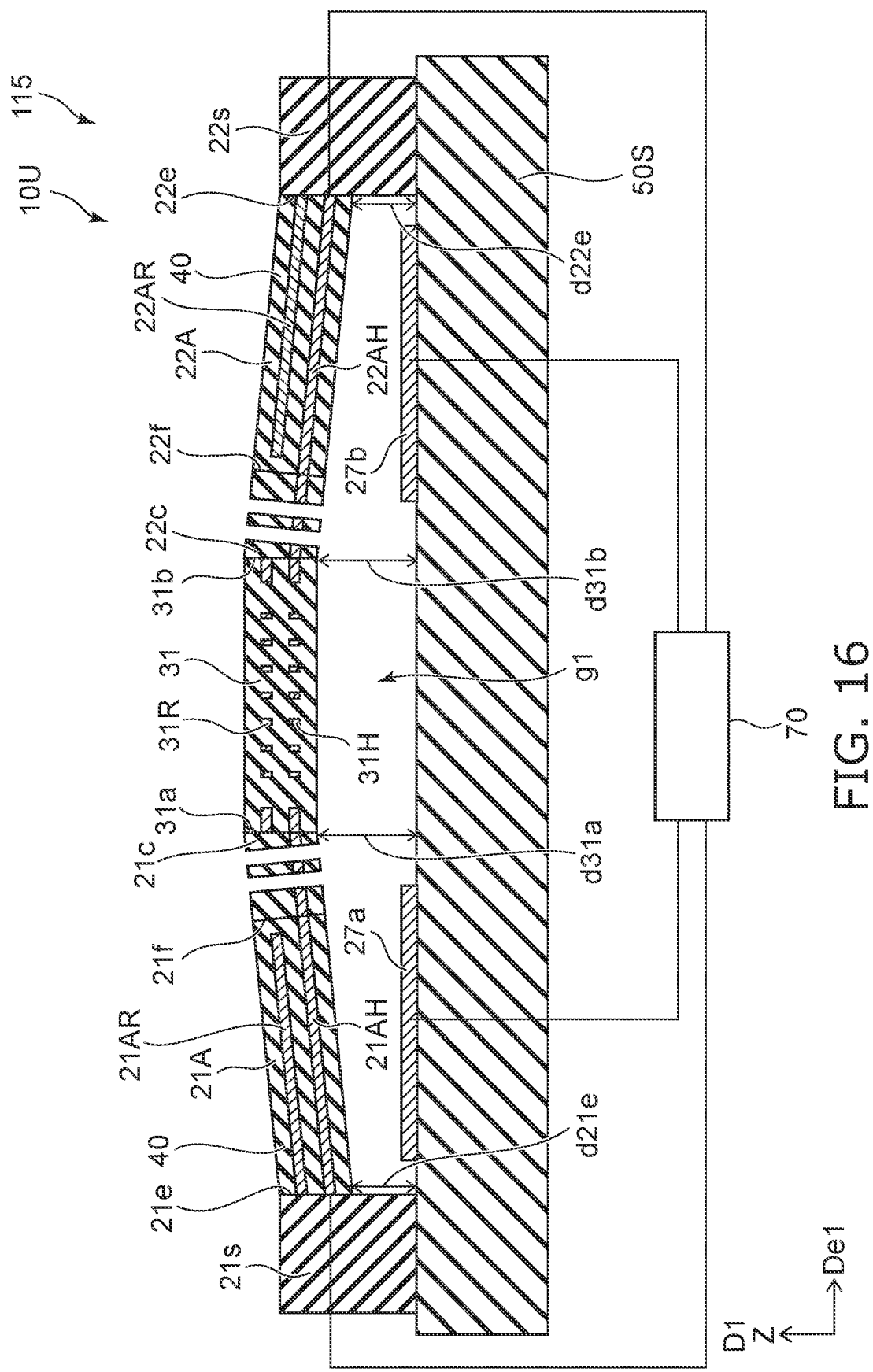
FIG. 16 is a schematic view illustrating the sensor according to the first embodiment.

FIGS. 15 and 16 are schematic views illustrating a sensor according to the first embodiment.

FIG. 15 is a plan view. FIG. 16 is a cross-sectional view. In the sensor 115 according to the embodiment as shown in FIG. 15, the element part 10U includes a first fixed electrode 27a. Otherwise, the configuration of the sensor 115 may be similar to those of the sensors 110 to 114.

As shown in FIG. 16, the first fixed electrode 27a is fixed to the base body 50S. The first fixed electrode 27a faces the first structure body 21A in the first direction D1. The controller 70 is configured to detect the change of the electrical capacitance between the first fixed electrode 27a and the first structure body conductive layer 21AH. The controller 70 is configured to control the first control current i1 based on the change of the electrical capacitance (see FIG. 15). The level of the film part 31 can be controlled with higher accuracy.

In the example, the element part 10U includes a second fixed electrode 27b, a third fixed electrode 27c, and a fourth fixed electrode 27d. The second fixed electrode 27b, the third fixed electrode 27c, and the fourth fixed electrode 27d are fixed to the base body 50S. The second fixed electrode 27b faces the second structure body 22A in the first direction D1. The third fixed electrode 27c faces the third structure body 23A in the first direction D1. The fourth fixed electrode 27d faces the fourth structure body 24A in the first direction D1.

For example, the controller 70 may control the second control current i2 based on the change of the electrical capacitance between the second fixed electrode 27b and the second structure body conductive layer 22AH (see FIG. 15). For example, the controller 70 may control the third control current i3 based on the change of the electrical capacitance between the third fixed electrode 27c and the third structure body conductive layer 23AH (see FIG. 15). For example, the controller 70 may control the fourth control current i4 based on the change of the electrical capacitance between the fourth fixed electrode 27d and the fourth structure body conductive layer 24AH (see FIG. 15).

Figure 17:
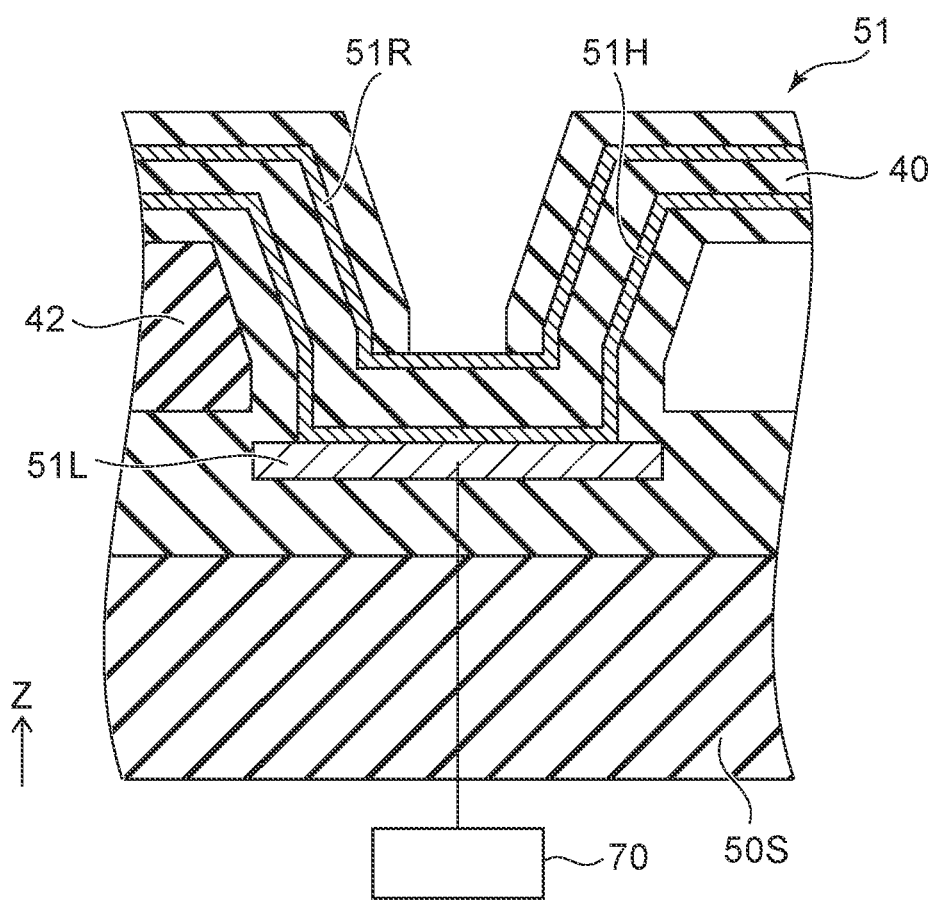
FIG. 17 is a schematic cross-sectional view illustrating a part of the sensor according to the first embodiment.
Figure 18:
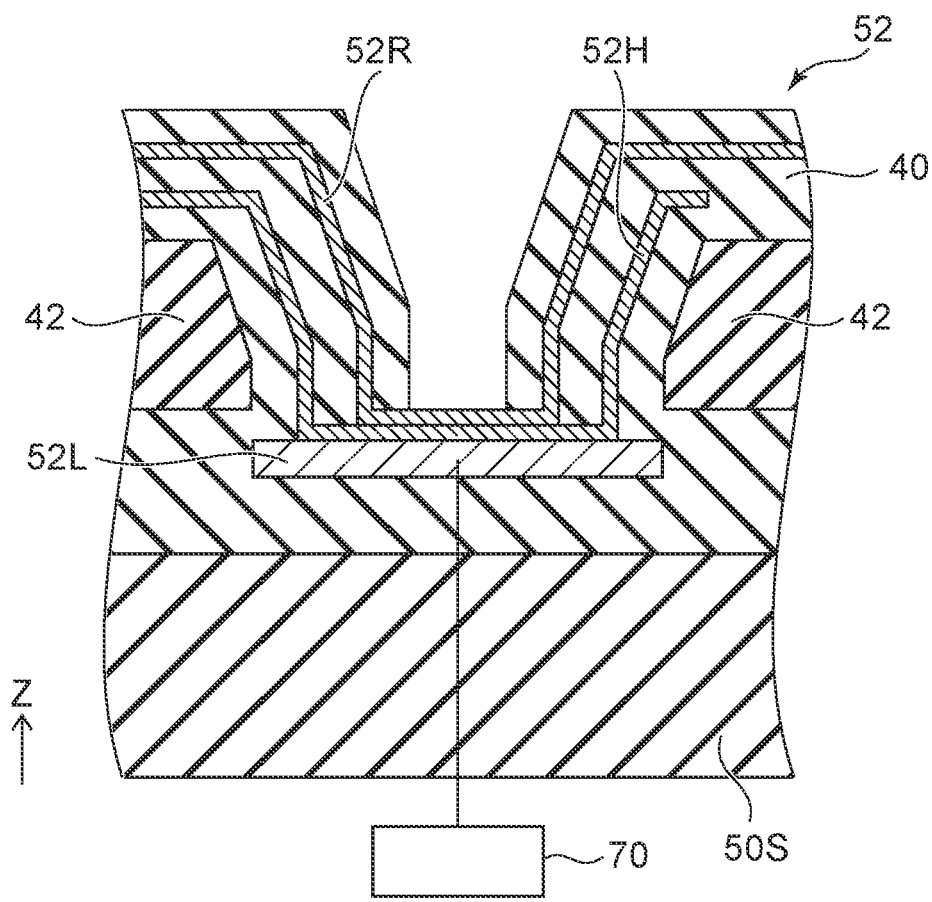
FIG. 18 is a schematic cross-sectional view illustrating a part of the sensor according to the first embodiment.

FIGS. 17 and 18 are schematic cross-sectional views illustrating a part of the sensor according to the first embodiment.

As shown in FIG. 17, the first terminal 51 includes a conductive layer 51R and a conductive layer 51H. For example, the conductive layer 51R may be electrically connected with one of the first connection resistance layer 11cR, the second connection resistance layer 12cR, the first structure body resistance layer 21AR, the second structure body resistance layer 22AR, the third structure body resistance layer 23AR, or the fourth structure body resistance layer 24AR. The conductive layer 51H may be electrically connected with one of the first connection conductive layer 11cH, the second connection conductive layer 12cH, the first structure body conductive layer 21AH, the second structure body conductive layer 22AH, the third structure body conductive layer 23AH, or the fourth structure body conductive layer 24AH. The conductive layer 51H may be electrically connected with the controller 70 via a conductive layer 51L.

As shown in FIG. 18, the second terminal 52 includes a conductive layer 52R and a conductive layer 52H. In the second terminal 52, the conductive layer 52R is electrically connected with the conductive layer 52H. For example, the conductive layer 52R may be electrically connected with one of the first connection resistance layer 11cR, the second connection resistance layer 12cR, the first structure body resistance layer 21AR, the second structure body resistance layer 22AR, the third structure body resistance layer 23AR, or the fourth structure body resistance layer 24AR. The conductive layer 52H may be electrically connected with the controller 70 via a conductive layer 52L.

As shown in FIGS. 17 and 18, the first terminal 51 and the second terminal 52 may include a second insulating member 42. The second insulating member 42 may be, for example, the remainder of a sacrificial layer.

Figure 19:
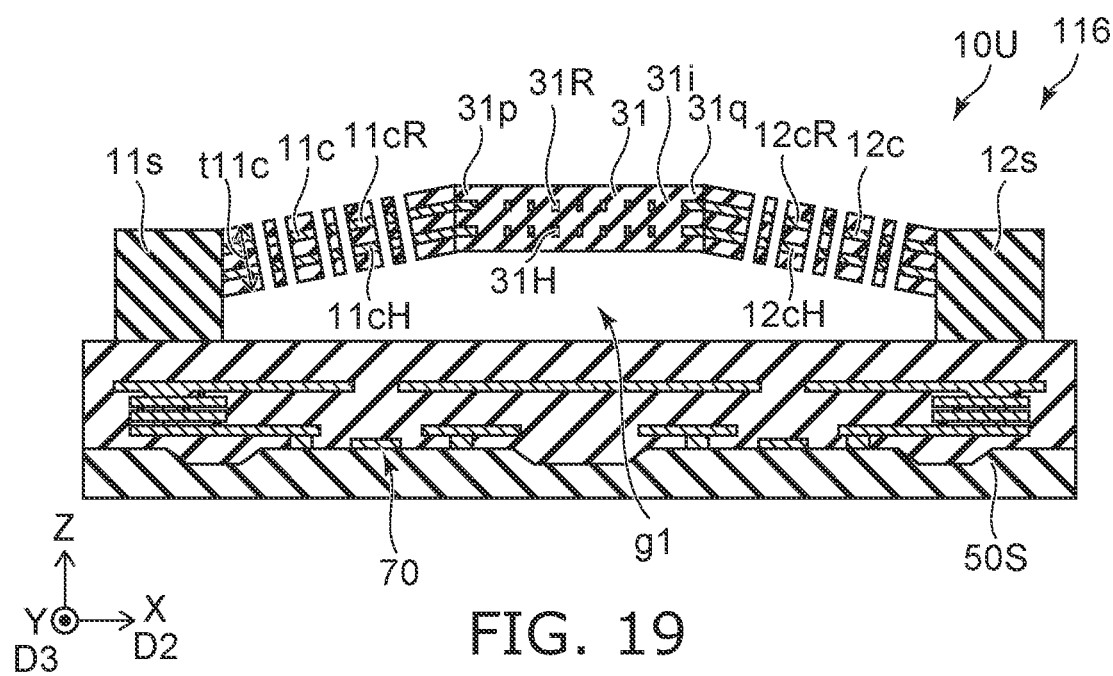
FIG. 19 is a schematic cross-sectional view illustrating a sensor according to the first embodiment.

FIG. 19 is a schematic cross-sectional view illustrating a sensor according to the first embodiment.

In the sensor 116 as shown in FIG. 19, the base body 50S may include at least a part of the controller 70. The controller 70 includes, for example, a transistor, etc. The transistor may be located in the base body 50S. The controller 70 may include a detection circuit. At least a part of the detection circuit may be located in the base body 50S. The controller 70 may include a microcomputer. At least a part of the microcomputer may be located in the base body 50S.

Second Embodiment

Figure 20:
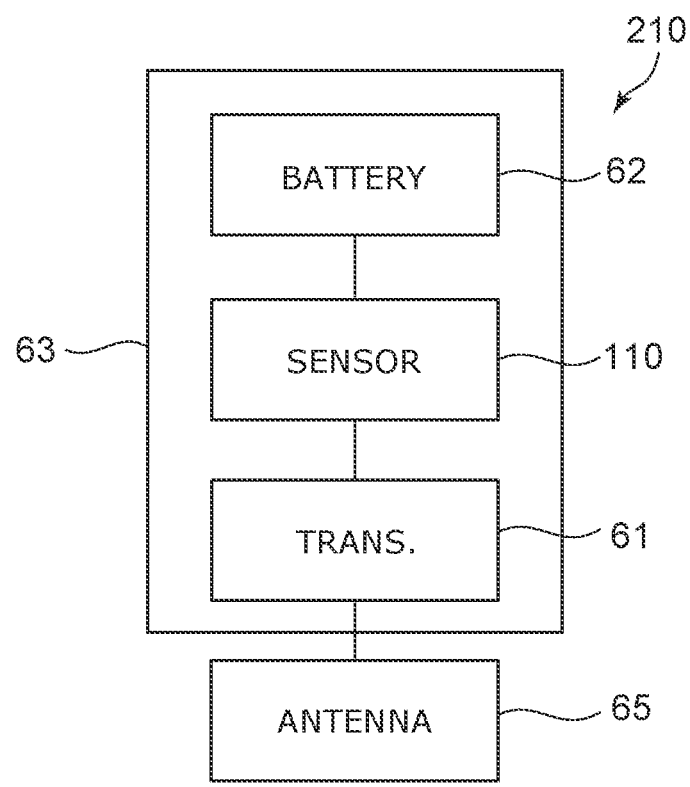
FIG. 20 is a block diagram illustrating a sensor system according to a second embodiment.

FIG. 20 is a block diagram illustrating a sensor system according to a second embodiment.

As shown in FIG. 20, the sensor system 210 according to the embodiment includes a transceiver 61 and a sensor (e.g., the sensor 110) according to the first embodiment. The transceiver 61 is connected with the sensor 110. The transceiver 61 is configured to communicate. For example, the transceiver 61 is configured to perform wireless communication.

The sensor system 210 may include, for example, an antenna 65. The transceiver 61 is configured to communicate via the antenna 65. The sensor system 210 may include a battery 62. Electrical power is supplied from the battery 62 to the sensor 110. The sensor 110, the transceiver 61, and the battery 62 may be located inside a housing 63.

Embodiments may include the following configurations (e.g., technological proposals).

Configuration 1
  A sensor, comprising:
    an element part including
      a base body,
      a first detection support part fixed to the base body,
      a first detection connection part supported by the first detection support part, the first detection connection part including a first connection resistance layer,
      a first support part fixed to the base body,
      a first structure body, the first structure body including a first end part and a first other end part, the first end part being supported by the first support part,
      a first connection part supported by the first other end part, and
      a film part, the film part including a first detection part and a first part, the first detection part being supported by the first detection connection part, the first part being supported by the first connection part, the film part including a film part resistance layer electrically connected with the first connection resistance layer,
    a second direction being from the first detection support part toward the first detection part and crossing a first direction from the base body toward the first detection support part,
    a first support part direction being from the first support part toward the first part and crossing the first and second directions,
    a first gap being provided between the base body and the film part, between the base body and the first detection connection part, between the base body and the first structure body, and between the base body and the first connection part,
    a distance along the first direction between the base body and the first part being greater than a distance along the first direction between the base body and the first end part.

Configuration 2
  The sensor according to Configuration 1, wherein
  the first structure body has a first structure body width in a first structure body width direction,
  the first structure body width direction crosses the first direction and crosses a direction from the first end part toward the first other end part,
  the first connection part has a first width in a first connection width direction,
  the first connection width direction crosses the first direction and crosses an extension direction of a path from the first other end part toward the first part, and
  the first structure body width is greater than the first width.

Configuration 3
  The sensor according to Configuration 1, wherein
  the first detection connection part includes:
    a first detection length along an extension path of the first detection connection part;
    a first detection width along a direction crossing the first direction and crossing the extension path of the first detection connection part;
    a first detection thickness along the first direction; and
    a first detection Young's modulus, and
  the first connection part includes at least one of:
    a first length that is less than the first detection length, the first length being along a first extension direction of the first connection part;
    a first width that is greater than the first detection width, the first width being along a direction crossing the first extension direction and crossing the first direction;
    a first thickness that is greater than the first detection thickness, the first thickness being along the first direction; or
    a first Young's modulus that is greater than the first detection Young's modulus.

Configuration 4
  The sensor according to any one of Configurations 1 to 3, wherein
  the first detection connection part includes a first connection conductive layer, and the film part includes a film part conductive layer electrically connected with the first connection conductive layer.

Configuration 5

The sensor according to any one of Configurations 1 to 3, wherein
the element part includes:
  a second detection support part fixed to the base body; and
  a second detection connection part supported by the second detection support part, the second detection connection part including a second connection conductive layer,
the film part includes a second detection part,
the second detection part is supported by the second detection connection part,
the film part includes a film part conductive layer electrically connected with the second connection conductive layer,
a direction from the second detection support part toward the second detection part crosses the first direction, and
the first gap is located between the base body and the second detection connection part.

Configuration 6

The sensor according to Configuration 1, wherein
the element part further includes:
  a second detection support part fixed to the base body;
  a second detection connection part supported by the second detection support part, the second detection connection part including a second connection conductive layer and a second connection resistance layer;
  a second support part fixed to the base body;
  a second structure body, the second structure body including a second end part and a second other end part, the second end part being supported by the second support part; and
  a second connection part supported by the second other end part,
the film part includes a second detection part and a second part,
the second detection part is supported by the second detection connection part,
the second part is supported by the second connection part,
the film part conductive layer is electrically connected with the second connection conductive layer,
the film part resistance layer is electrically connected with the second connection resistance layer,
a direction from the second detection support part toward the second detection part is along the second direction,
the film part is between the first detection connection part and the second detection connection part in the second direction,
a second support part direction from the second support part toward the second part crosses the first direction and is along the first support part direction,
the film part is between the first connection part and the second connection part in the first support part direction,
the first gap is located between the base body and the second detection connection part, between the base body and the second structure body, and between the base body and the second connection part, and a distance along the first direction between the base body and the second part is greater than a distance along the first direction between the base body and the second end part.

Configuration 7

The sensor according to Configuration 6, wherein
the second structure body has a second structure body width in a second structure body width direction,
the second structure body width direction crosses the first direction and crosses a direction from the second end part toward the second other end part,
the second connection part has a second width in a second connection width direction,
the second connection width direction crosses the first direction and crosses an extension direction of a path from the second other end part toward the second part, and
the second structure body width is greater than the second width.

Configuration 8

The sensor according to Configuration 6 or 7, wherein
the element part further includes:
  a third support part fixed to the base body;
  a third structure body, the third structure body including a third end part and a third other end part, the third end part being supported by the third support part;
  a third connection part supported by the third other end part;
  a fourth support part fixed to the base body;
  a fourth structure body, the fourth structure body including a fourth end part and a fourth other end part, the fourth end part being supported by the fourth support part; and
  a fourth connection part supported by the fourth other end part,
the film part includes a third part and a fourth part,
the third part is supported by the third connection part,
the fourth part is supported by the fourth connection part,
a third support part direction from the third support part toward the third part crosses the first direction,
a fourth support part direction from the fourth support part toward the fourth part crosses the first direction and is along the third support part direction,
the film part is between the third connection part and the fourth connection part in the third support part direction,
the first gap is located between the base body and the third structure body, between the base body and the third connection part, between the base body and the fourth structure body, and between the base body and the fourth connection part,
a distance along the first direction between the base body and the third part is greater than a distance along the first direction between the base body and the third end part,
a distance along the first direction between the base body and the fourth part is greater than a distance along the first direction between the base body and the fourth end part,
a position of the first detection connection part in a third direction is between a position of the first structure body in the third direction and a position of the third structure body in the third direction,
the third direction crosses a plane including the first and second directions, and
a position of the second detection connection part in the third direction is between a position of the fourth structure body in the third direction and a position of the second structure body in the third direction.

Configuration 9

The sensor according to Configuration 8, wherein an angle between the first support part direction and the third support part direction is not less than 88 degrees and not more than 92 degrees.

Configuration 10

The sensor according to Configuration 8 or 9, wherein the third structure body has a third structure body width in a third structure body width direction,
the third structure body width direction crosses the first direction and crosses a direction from the third end part toward the third other end part,
the third connection part has a third width in a third connection width direction,
the third connection width direction crosses the first direction and crosses an extension direction of a path from the third other end part toward the third part,
the third structure body width is greater than the third width,
the fourth structure body has a fourth structure body width in a fourth structure body width direction,
the fourth structure body width direction crosses the first direction and crosses a direction from the fourth end part toward the fourth other end part,
the fourth connection part has a fourth width in a fourth connection width direction,
the fourth connection width direction crosses the first direction and crosses an extension direction of a path from the fourth other end part toward the fourth part, and
the fourth structure body width is greater than the fourth width.

Configuration 11

The sensor according to any one of Configurations 1 to 10, wherein
the first structure body includes a first structure body conductive layer and a first insulating member,
the first insulating member includes a first insulating region and a second insulating region,
the first insulating region is between the base body and the second insulating region in the first direction,
the first structure body conductive layer is between the first insulating region and the second insulating region in the first direction, and
a thickness along the first direction of the first insulating region is different from a thickness along the first direction of the second insulating region.

Configuration 12

The sensor according to Configuration 11, wherein
the first structure body conductive layer includes at least one selected from the group consisting of Ti, TiN, Al, Cu, Si, and SiGe, and
the first insulating member includes silicon and at least one selected from the group consisting of oxygen and nitrogen.

Configuration 13

The sensor according to any one of Configurations 1 to 10, wherein
the first structure body includes a first structure body conductive layer and a first insulating member,
the first structure body includes a first surface and a second surface,
the first surface is between the base body and the second surface,
the first structure body conductive layer is between the first surface and the second surface in the first direction, and
a distance along the first direction between the first surface and the first structure body conductive layer is different from a distance along the first direction between the first structure body conductive layer and the second surface.

Configuration 14

The sensor according to any one of Configurations 1 to 10, wherein
the first structure body includes a first film and a first insulating member,
the first insulating member is between the base body and the first film,
the first film includes at least one selected from the group consisting of Pd, $SiO_2$, SiN, and SiGe, and
the first insulating member includes silicon and at least one selected from the group consisting of oxygen and nitrogen.

Configuration 15

The sensor according to any one of Configurations 1 to 14, further comprising:
a controller,
the controller being electrically connected with the first connection conductive layer,
the controller being configured to heat the film part by supplying a current to the film part conductive layer via the first connection conductive layer,
the controller being electrically connected with the first connection resistance layer,
the controller being configured to output a signal corresponding to a change of an electrical resistance of the film part resistance layer,
the signal corresponding to a concentration of a detection substance around the film part.

Configuration 16

The sensor according to any one of Configurations 11 to 13, further comprising:
a controller,
the first structure body including a first structure body resistance layer,
the controller being configured to supply a first control current to the first structure body resistance layer.

Configuration 17

The sensor according to Configuration 16, wherein
the controller is configured to control a distance along the first direction between the base body and the film part by controlling the first control current.

Configuration 18

The sensor according to Configuration 16 or 17, wherein
the first structure body conductive layer is between the base body and the first structure body resistance layer.

Configuration 19

The sensor according to any one of Configurations 16 to 18, wherein
the element part includes a first fixed electrode fixed to the base body,
the controller is configured to detect a change of an electrical capacitance between the first fixed electrode and the first structure body conductive layer, and
the controller is configured to control the first control current based on the change of the electrical capacitance.

Configuration 20

A sensor system, comprising:
the sensor according to any one of Configurations 1 to 19; and
a transceiver connected with the sensor,
the transceiver being configured to communicate externally.

According to embodiments, a sensor and a sensor system can be provided in which characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as base bodies, detectors, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors practicable by an appropriate design modification by one skilled in the art based on the sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

What is claimed is:

1. A sensor, comprising:
an element part including
a base body,
a first detection support part fixed to the base body,
a first detection connection part supported by the first detection support part, the first detection connection part including a first connection resistance layer,
a first support part fixed to the base body,
a first structure body, the first structure body including a first end part and a first other end part, the first end part being supported by the first support part,
a first connection part supported by the first other end part, and
a film part, the film part including a first detection part and a first part, the first detection part being supported by the first detection connection part, the first part being supported by the first connection part, the film part including a film part resistance layer electrically connected with the first connection resistance layer,
a second direction being from the first detection support part toward the first detection part and crossing a first direction from the base body toward the first detection support part,
a first support part direction being from the first support part toward the first part and crossing the first and second directions,
a first gap being provided between the base body and the film part, between the base body and the first detection connection part, between the base body and the first structure body, and between the base body and the first connection part,
a distance along the first direction between the base body and the first part being greater than a distance along the first direction between the base body and the first end part.

2. The sensor according to claim 1, wherein
the first structure body has a first structure body width in a first structure body width direction,
the first structure body width direction crosses the first direction and crosses a direction from the first end part toward the first other end part,
the first connection part has a first width in a first connection width direction,
the first connection width direction crosses the first direction and crosses an extension direction of a path from the first other end part toward the first part, and
the first structure body width is greater than the first width.

3. The sensor according to claim 1, wherein
the first detection connection part includes:
a first detection length along an extension path of the first detection connection part;
a first detection width along a direction crossing the first direction and crossing the extension path of the first detection connection part;
a first detection thickness along the first direction; and
a first detection Young's modulus, and
the first connection part includes at least one of:
a first length that is less than the first detection length, the first length being along a first extension direction of the first connection part;
a first width that is greater than the first detection width, the first width being along a direction crossing the first extension direction and crossing the first direction;
a first thickness that is greater than the first detection thickness, the first thickness being along the first direction; or
a first Young's modulus that is greater than the first detection Young's modulus.

4. The sensor according to claim 1, wherein
the first detection connection part includes a first connection conductive layer, and
the film part includes a film part conductive layer electrically connected with the first connection conductive layer.

5. The sensor according to claim 1, wherein
the element part includes:
a second detection support part fixed to the base body; and
a second detection connection part supported by the second detection support part, the second detection connection part including a second connection conductive layer,
the film part includes a second detection part,
the second detection part is supported by the second detection connection part,
the film part includes a film part conductive layer electrically connected with the second connection conductive layer,
a direction from the second detection support part toward the second detection part crosses the first direction, and
the first gap is located between the base body and the second detection connection part.

6. The sensor according to claim 1, wherein
the element part further includes:
- a second detection support part fixed to the base body;
- a second detection connection part supported by the second detection support part, the second detection connection part including a second connection conductive layer and a second connection resistance layer;
- a second support part fixed to the base body;
- a second structure body, the second structure body including a second end part and a second other end part, the second end part being supported by the second support part; and
- a second connection part supported by the second other end part, the film part includes a second detection part and a second part,
the second detection part is supported by the second detection connection part,
the second part is supported by the second connection part,
the film part conductive layer is electrically connected with the second connection conductive layer,
the film part resistance layer is electrically connected with the second connection resistance layer,
a direction from the second detection support part toward the second detection part is along the second direction,
the film part is between the first detection connection part and the second detection connection part in the second direction,
a second support part direction from the second support part toward the second part crosses the first direction and is along the first support part direction,
the film part is between the first connection part and the second connection part in the first support part direction,
the first gap is located between the base body and the second detection connection part, between the base body and the second structure body, and between the base body and the second connection part, and
a distance along the first direction between the base body and the second part is greater than a distance along the first direction between the base body and the second end part.

7. The sensor according to claim 6, wherein
the second structure body has a second structure body width in a second structure body width direction,
the second structure body width direction crosses the first direction and crosses a direction from the second end part toward the second other end part,
the second connection part has a second width in a second connection width direction,
the second connection width direction crosses the first direction and crosses an extension direction of a path from the second other end part toward the second part, and
the second structure body width is greater than the second width.

8. The sensor according to claim 6, wherein
the element part further includes:
- a third support part fixed to the base body;
- a third structure body, the third structure body including a third end part and a third other end part, the third end part being supported by the third support part;
- a third connection part supported by the third other end part;
- a fourth support part fixed to the base body;
- a fourth structure body, the fourth structure body including a fourth end part and a fourth other end part, the fourth end part being supported by the fourth support part; and
- a fourth connection part supported by the fourth other end part, the film part includes a third part and a fourth part,
the third part is supported by the third connection part,
the fourth part is supported by the fourth connection part,
a third support part direction from the third support part toward the third part crosses the first direction,
a fourth support part direction from the fourth support part toward the fourth part crosses the first direction and is along the third support part direction,
the film part is between the third connection part and the fourth connection part in the third support part direction,
the first gap is located between the base body and the third structure body, between the base body and the third connection part, between the base body and the fourth structure body, and between the base body and the fourth connection part,
a distance along the first direction between the base body and the third part is greater than a distance along the first direction between the base body and the third end part,
a distance along the first direction between the base body and the fourth part is greater than a distance along the first direction between the base body and the fourth end part,
a position of the first detection connection part in a third direction is between a position of the first structure body in the third direction and a position of the third structure body in the third direction,
the third direction crosses a plane including the first and second directions, and
a position of the second detection connection part in the third direction is between a position of the fourth structure body in the third direction and a position of the second structure body in the third direction.

9. The sensor according to claim 8, wherein
an angle between the first support part direction and the third support part direction is not less than 88 degrees and not more than 92 degrees.

10. The sensor according to claim 8, wherein
the third structure body has a third structure body width in a third structure body width direction,
the third structure body width direction crosses the first direction and crosses a direction from the third end part toward the third other end part,
the third connection part has a third width in a third connection width direction,
the third connection width direction crosses the first direction and crosses an extension direction of a path from the third other end part toward the third part,
the third structure body width is greater than the third width,
the fourth structure body has a fourth structure body width in a fourth structure body width direction,
the fourth structure body width direction crosses the first direction and crosses a direction from the fourth end part toward the fourth other end part,
the fourth connection part has a fourth width in a fourth connection width direction, the fourth connection width direction crosses the first direction and crosses an extension direction of a path from the fourth other end part toward the fourth part, and the fourth structure body width is greater than the fourth width.

11. The sensor according to claim 1, wherein the first structure body includes a first structure body conductive layer and a first insulating member, the first insulating member includes a first insulating region and a second insulating region, the first insulating region is between the base body and the second insulating region in the first direction, the first structure body conductive layer is between the first insulating region and the second insulating region in the first direction, and a thickness along the first direction of the first insulating region is different from a thickness along the first direction of the second insulating region.

12. The sensor according to claim 11, wherein the first structure body conductive layer includes at least one selected from the group consisting of Ti, TiN, Al, Cu, Si, and SiGe, and the first insulating member includes silicon and at least one selected from the group consisting of oxygen and nitrogen.

13. The sensor according to claim 1, wherein the first structure body includes a first structure body conductive layer and a first insulating member, the first structure body includes a first surface and a second surface, the first surface is between the base body and the second surface, the first structure body conductive layer is between the first surface and the second surface in the first direction, and a distance along the first direction between the first surface and the first structure body conductive layer is different from a distance along the first direction between the first structure body conductive layer and the second surface.

14. The sensor according to claim 1, wherein the first structure body includes a first film and a first insulating member, the first insulating member is between the base body and the first film, the first film includes at least one selected from the group consisting of Pd, $SiO_2$, SiN, and SiGe, and the first insulating member includes silicon and at least one selected from the group consisting of oxygen and nitrogen.

15. The sensor according to claim 1, further comprising:

a controller, the controller being electrically connected with the first connection conductive layer, the controller being configured to heat the film part by supplying a current to the film part conductive layer via the first connection conductive layer, the controller being electrically connected with the first connection resistance layer, the controller being configured to output a signal corresponding to a change of an electrical resistance of the film part resistance layer, the signal corresponding to a concentration of a detection substance around the film part.

16. The sensor according to claim 11, further comprising:

a controller, the first structure body including a first structure body resistance layer, the controller being configured to supply a first control current to the first structure body resistance layer.

17. The sensor according to claim 16, wherein the controller is configured to control a distance along the first direction between the base body and the film part by controlling the first control current.

18. The sensor according to claim 16, wherein the first structure body conductive layer is between the base body and the first structure body resistance layer.

19. The sensor according to claim 16, wherein the element part includes a first fixed electrode fixed to the base body, the controller is configured to detect a change of an electrical capacitance between the first fixed electrode and the first structure body conductive layer, and the controller is configured to control the first control current based on the change of the electrical capacitance.

20. A sensor system, comprising:

the sensor according to claim 1; and a transceiver connected with the sensor, the transceiver being configured to communicate externally.

\* \* \* \* \*